US 11,450,655 B2

(12) United States Patent
You et al.

(10) Patent No.: US 11,450,655 B2
(45) Date of Patent: Sep. 20, 2022

(54) DISPLAY DEVICE AND METHOD OF MANUFACTURING THE SAME

(71) Applicant: Samsung Display Co., Ltd., Yongin-si (KR)

(72) Inventors: Jun Woo You, Yongin-si (KR); Byoung Dae Ye, Yongin-si (KR); Ae Ly Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 23 days.

(21) Appl. No.: 17/021,917

(22) Filed: Sep. 15, 2020

(65) Prior Publication Data

US 2021/0280569 A1 Sep. 9, 2021

(30) Foreign Application Priority Data

Mar. 6, 2020 (KR) .......................... 10-2020-0028581

(51) Int. Cl.
*H01L 25/18* (2006.01)
*H01L 25/16* (2006.01)
*H01L 25/00* (2006.01)
*H01L 27/30* (2006.01)

(52) U.S. Cl.
CPC ............ *H01L 25/18* (2013.01); *H01L 25/167* (2013.01); *H01L 25/50* (2013.01); *H01L 27/307* (2013.01)

(58) Field of Classification Search
CPC ....... H01L 25/18; H01L 25/167; H01L 25/50; H01L 27/307; H01L 27/3272
See application file for complete search history.

(56) References Cited

U.S. PATENT DOCUMENTS

| | | |
|---|---|---|
| 10,181,070 B2 | 1/2019 | Smith et al. |
| 10,410,036 B2 | 9/2019 | He et al. |
| 2016/0224816 A1 | 8/2016 | Smith et al. |
| 2016/0266695 A1 | 9/2016 | Bae et al. |
| 2019/0179488 A1 | 6/2019 | Klenkler et al. |
| 2019/0180072 A1 | 6/2019 | Fomani et al. |
| 2019/0220121 A1 | 7/2019 | Kim et al. |
| 2019/0296266 A1 | 9/2019 | Kim et al. |
| 2021/0132891 A1* | 5/2021 | Ye ........................ H01L 27/3276 |
| 2021/0167144 A1* | 6/2021 | Lim ..................... H01L 51/5284 |
| 2021/0191161 A1* | 6/2021 | Lee ........................ G02F 1/0126 |
| 2021/0327963 A1* | 10/2021 | Lee ......................... G02B 5/201 |
| 2022/0130907 A1* | 4/2022 | Song ....................... H01L 24/00 |

FOREIGN PATENT DOCUMENTS

| | | |
|---|---|---|
| KR | 10-1924916 B1 | 12/2018 |
| KR | 10-2019-0088147 A | 7/2019 |
| KR | 10-2019-0112223 A | 10/2019 |
| KR | 10-2019-0121604 A | 10/2019 |

* cited by examiner

Primary Examiner — Thao P Le
(74) Attorney, Agent, or Firm — Lewis Roca Rothgerber Christie LLP

(57) ABSTRACT

A display device includes: a photo sensor layer to receive light reflected from an external object; a substrate on the photo sensor layer; an optical pattern layer on the substrate, the optical pattern layer including a light blocking portion, and a light transmitting portion corresponding to an opening penetrating the light blocking portion in one direction; an optical filter in the light transmitting portion of the optical pattern layer; and a light emitting device layer on the optical pattern layer.

20 Claims, 18 Drawing Sheets

DISPLAY DEVICE AND METHOD OF MANUFACTURING THE SAME

CROSS-REFERENCE TO RELATED APPLICATION

This application claims priority to and the benefit of Korean patent application 10-2020-0028581, filed on Mar. 6, 2020 in the Korean Intellectual Property Office, the entire disclosure of which is incorporated herein by reference.

BACKGROUND

1. Field

Aspects of the present disclosure generally relate to a display device including a photo sensor, and a method of manufacturing the display device.

2. Description of the Related Art

As information society is developed, demand for display devices for displaying images have increased in various forms. For example, the display devices have been applied to various electronic devices such as smartphones, digital cameras, notebook computers, navigation systems, and smart televisions.

Recently, technology for integrating and unifying a biometric sensor for recognizing a fingerprint or the like with a display panel occupying the widest area in a display device has been researched and developed.

The above information disclosed in this Background section is for enhancement of understanding of the background of the present disclosure, and therefore, it may contain information that does not constitute prior art.

SUMMARY

One or more example embodiments of the present disclosure are directed to a display device having an optical structure in which an optical pattern layer having a collimator array structure and an optical filter for blocking transfer of light having a specific wavelength are integrated with each other.

One or more example embodiments of the present disclosure are directed to a method of manufacturing the display device.

According to one or more example embodiments of the present disclosure, a display device includes: a photo sensor layer configured to receive light reflected from an external object; a substrate on the photo sensor layer; an optical pattern layer on the substrate, the optical pattern layer including a light blocking portion, and a light transmitting portion corresponding to an opening penetrating the light blocking portion in one direction; an optical filter in the light transmitting portion of the optical pattern layer; and a light emitting device layer on the optical pattern layer.

In an example embodiment, the optical filter may include at least two filter layers having different refractive indices from each other.

In an example embodiment, the optical filter may include: a first filter layer having a first refractive index; and a second filter layer having a second refractive index different from the first refractive index, and the first filter layer and the second filter layer may be alternately stacked on one another.

In an example embodiment, each of the first filter layer and the second filter layer may include eight stacked layers or more.

In an example embodiment, the first filter layer and the second filter layer may include different inorganic materials from each other.

In an example embodiment, a difference between the first refractive index and the second refractive index may be greater than 0.3.

In an example embodiment, the first filter layer may include silicon oxide, and the second filter layer may include titanium oxide.

In an example embodiment, a thickness of the optical filter may be less than or equal to a thickness of the light blocking portion.

In an example embodiment, the display device may further include: a transparent layer at at least one of an upper portion and a lower portion of the optical filter, and the transparent layer may be filled in the light transmitting portion.

In an example embodiment, a distance between a top surface of the optical filter and the substrate may be less than or equal to a distance between a top surface of the light blocking portion and the substrate.

In an example embodiment, the optical filter may be configured to block light having a wavelength greater than or equal to 580 nm from being transmitted through to the photo sensor layer.

In an example embodiment, a side surface of the first filter layer and a side surface of the second filter layer may be in direct contact with a side surface of the light blocking portion.

In an example embodiment, the optical pattern layer may include an optical collimator array, and may be configured to transfer the reflected light to the photo sensor layer.

In an example embodiment, the optical pattern layer may include at least one from among an organic light blocking material and a metal light blocking material.

According to one or more example embodiments of the present disclosure, a method of manufacturing a display device, includes: coating a light blocking material on a substrate; forming an optical pattern layer by patterning the light blocking material, the optical pattern layer including a light blocking portion, and a light transmitting portion corresponding to an opening penetrating the light blocking portion in one direction; alternately stacking a first filter layer having a first refractive index and a second filter layer having a second refractive index on the light blocking portion and the light transmitting portion; forming an optical filter by repeating the stacking of the first filter layer and the second filter layer; polishing a top surface of the optical filter; and providing a display panel including a light emitting device layer on the substrate on which the optical pattern layer and the optical filter are formed.

In an example embodiment, the optical filter may be formed in the light transmitting portion of the optical pattern layer.

In an example embodiment, a distance between the polished top surface of the optical filter and the substrate may be less than or equal to a distance between a top surface of the light blocking portion and the substrate.

In an example embodiment, the method may further include: providing the substrate on which the optical pattern layer and the optical filter are formed on a photo sensor layer configured to receive light reflected from an external object.

In an example embodiment, the optical filter may be configured to block light having a wavelength greater than or equal to 580 nm from being transmitted through to the photo sensor layer.

In an example embodiment, the first filter layer and the second filter layer may include different inorganic materials from each other, and a difference between the first refractive index and the second refractive index may be greater than 0.3.

According to one or more example embodiments of the present disclosure, the optical filter, which may block transmission of light having a suitable wavelength (e.g., a predetermined wavelength), for example, such as about 580 nm or greater, may be integrally formed with the optical pattern layer having a collimator array structure. In other words, the optical filter may be a separate part or film from the optical pattern layer, and may be integrally formed with the optical pattern layer such that a space and/or a manufacturing process for an arrangement of the optical filter may be reduced. Accordingly, a thickness and/or manufacturing costs of the display device may be reduced.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
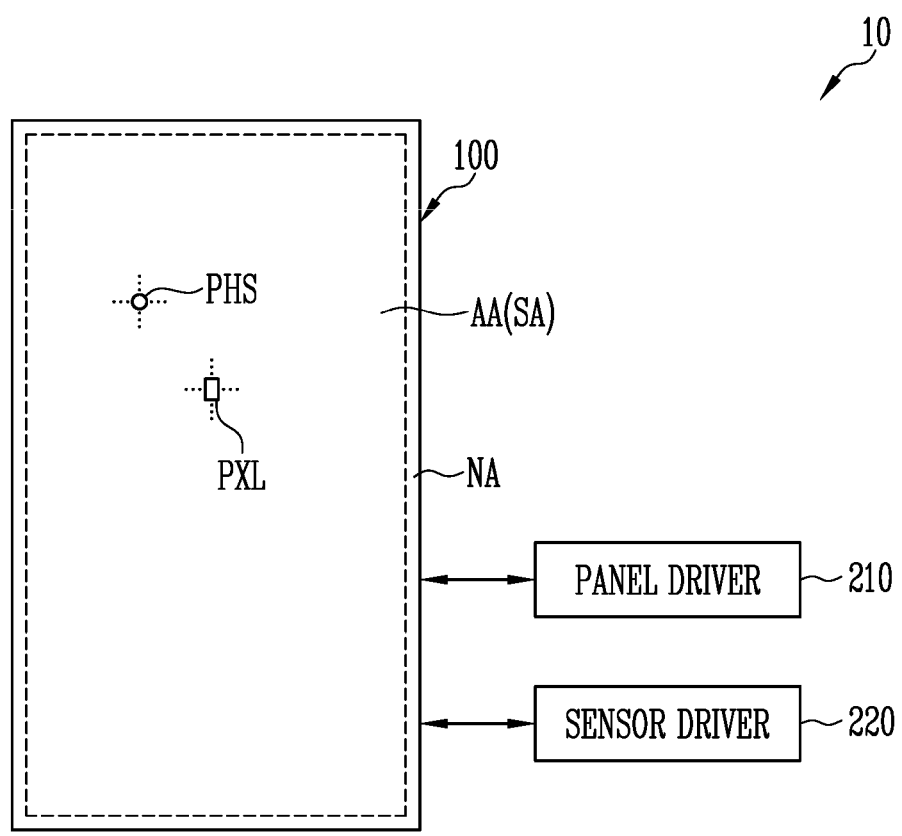
FIG. 1 is a block diagram illustrating a display device in accordance with one or more example embodiments of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has, " "have, " and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device in accordance with one or more example embodiments of the present disclosure.

Referring to FIG. 1, the display device 10 may include a display panel 100, a panel driver 210, and a sensor driver 220.

The display panel 100 includes a display area AA and a non-display area NA. The display area AA may be an area at (e.g., in or on) which a plurality of pixels PXL (which may be referred to as sub-pixels) are provided. Each of the pixels PXL may include at least one light emitting device. The display device 10 drives the pixels PXL corresponding to (e.g., according to) image data input from the outside, thereby displaying an image at (e.g., in or on) the display area AA.

The non-display area NA may be an area disposed at a periphery of the display area AA. For example, the non-display area NA may surround (e.g., around a periphery of) the display area AA. In an embodiment, the non-display area NA may inclusively refer to other areas of the display panel 100 except for the display area AA. For example, the non-display area NA may include a line area, a pad area, one or more dummy areas, and/or the like.

In an embodiment, a sensing area SA may be included in at least a portion of the display area AA. The sensing area SA may vertically overlap with at least some of the pixels PXL from among the pixels PXL provided at (e.g., in or on) the display area AA. For example, an entirety (e.g., the whole) of the display area AA may correspond to (e.g., may be set as) the sensing area SA. However, the present disclosure is not limited thereto, and in other embodiments, only a portion of the display area AA may correspond to (e.g., may be set as) the sensing area SA, and/or a plurality of sensing areas SA may be included at (e.g., in or on) the display area AA. In some embodiments, the sensing area SA may be included in at least a portion of the non-display area NA.

The display device 10 may further include a plurality of photo sensors PHS provided at (e.g., in or on) the sensing area SA. In an embodiment, the photo sensors PHS may sense light emitted from a light source (e.g., a light emitting device) that is reflected by a finger of a user, and a fingerprint of the user may be sensed according to (e.g., by analyzing) the reflected light. Hereinafter, an example in which the photo sensors PHS are used for fingerprint sensing is described for convenience. However, the present disclosure is not limited thereto, and in other embodiments, the photo sensors PHS may sense various kinds of biometric information, for example, such as an iris of the user.

The photo sensors PHS may overlap with at least some of or all of the pixels PXL provided at (e.g., in or on) the sensing area SA, or may be arranged at (e.g., to surround) a periphery of the pixels PXL.

In an embodiment, the photo sensors PHS may be arranged on another surface (e.g., a rear surface, a bottom surface, or an opposite surface) facing away from a surface (e.g., a front surface or a top surface) at (e.g., in or on) which an image is displayed from among the two surfaces (e.g., the front surface and the rear surface) of the display panel 100. However, the present disclosure is not limited thereto.

The display device 10 may include the panel driver 210 and the sensor driver 220. For convenience, although a case where the panel driver 210 and the sensor driver 220 are separated (e.g., implemented separately) from each other is illustrated in FIG. 1, the present disclosure is not limited thereto. For example, in some embodiments, at least a portion of the sensor driver 220 may be included in (e.g., may be integrated with) the panel driver 210, or may operate in connection with the panel driver 210.

The panel driver 210 may supply a data signal corresponding to image data (e.g., corresponding to an image) to the pixels PXL while scanning the pixels PXL of the display area AA. The display panel 100 may display an image corresponding to the image data.

In an embodiment, the panel driver 210 may supply the pixels PXL with a driving signal for fingerprint sensing. The driving signal may be provided to allow the pixels PXL to operate as light sources for the photo sensors PHS by emitting light. However, the present disclosure is not limited thereto, and in other embodiments, the driving signal for fingerprint sensing may be provided by the sensor driver 220.

The sensor driver 220 may transfer a driving signal for driving the photo sensors PHS to the photo sensors PHS, and may detect biometric information, for example, such as a fingerprint of a user, according to (e.g., based on) a sensing signal received from the photo sensors PHS.

FIGS. 2A to 2E are plan views illustrating various examples of an arrangement structure of the pixels and the photo sensors included in the display device shown in FIG. 1.

Referring to FIGS. 2A to 2E, the photo sensors PHS at (e.g., in or on) the sensing area SA may be disposed at (e.g., in or on) a different layer from that of the pixels PXL.

Figure 2A:
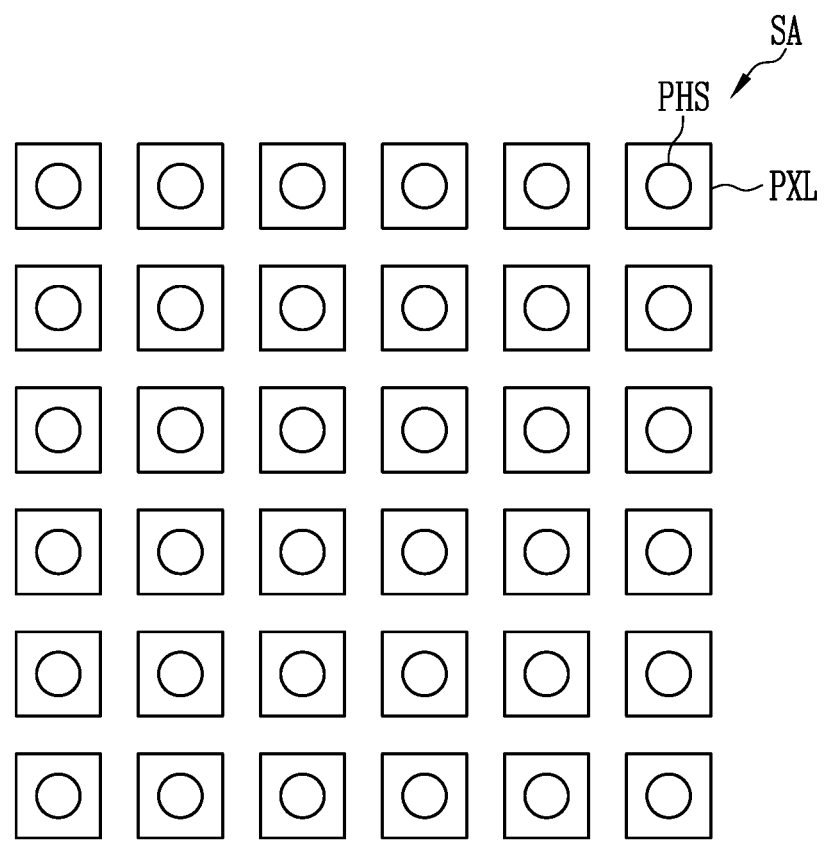
FIGS. 2A-2E are plan views illustrating various examples of an arrangement structure of pixels and photo sensors included in the display device shown in FIG. 1.

In an embodiment, as shown in FIG. 2A, the photo sensors PHS may be arranged with a resolution (e.g., a density) that is equal to or substantially equal to that of the pixels PXL at (e.g., in or on) the sensing area SA. For example, a number of the pixels PXL and a number of the photo sensors PHS may be the same or substantially the same as each other at (e.g., in or on) the sensing area SA. Although a case where the pixels PXL and the photo sensors PHS overlap with each other is illustrated in FIG. 2A, the present disclosure is not limited thereto, and the pixels PXL and the photo sensors PHS may not overlap with each other, or may partially overlap with each other (e.g., portions of the pixels PXL and the photo sensors PHS may overlap with each other).

Although FIG. 2A shows a case where the photo sensors PHS have a smaller size than that of the pixels PXL, the present disclosure is not limited thereto, and in other embodiments, the photo sensors PHS may have a size that is equal to (or substantially equal to) or larger than that of the pixels PXL.

Referring to FIGS. 2B to 2E, the photo sensors PHS may be arranged with a resolution lower than that of pixels PXL at (e.g., in or on) the sensing area SA. For example, a number of the photo sensors PHS may be less than that of the pixels PXL arranged at (e.g., in or on) the sensing area SA.

Figure 2B:
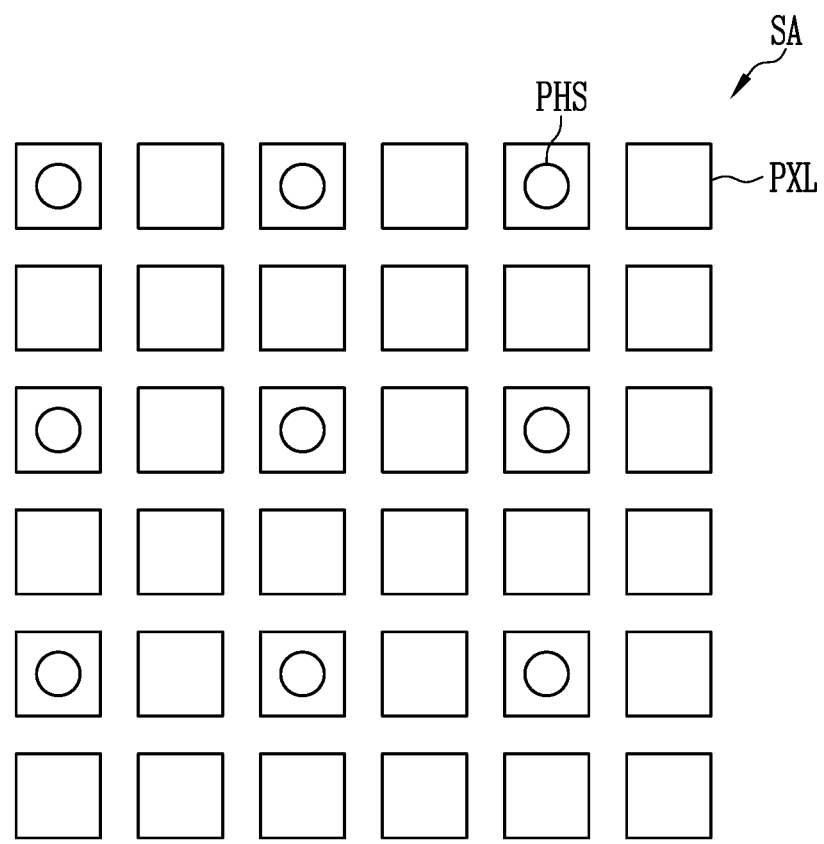
Figure 2C:
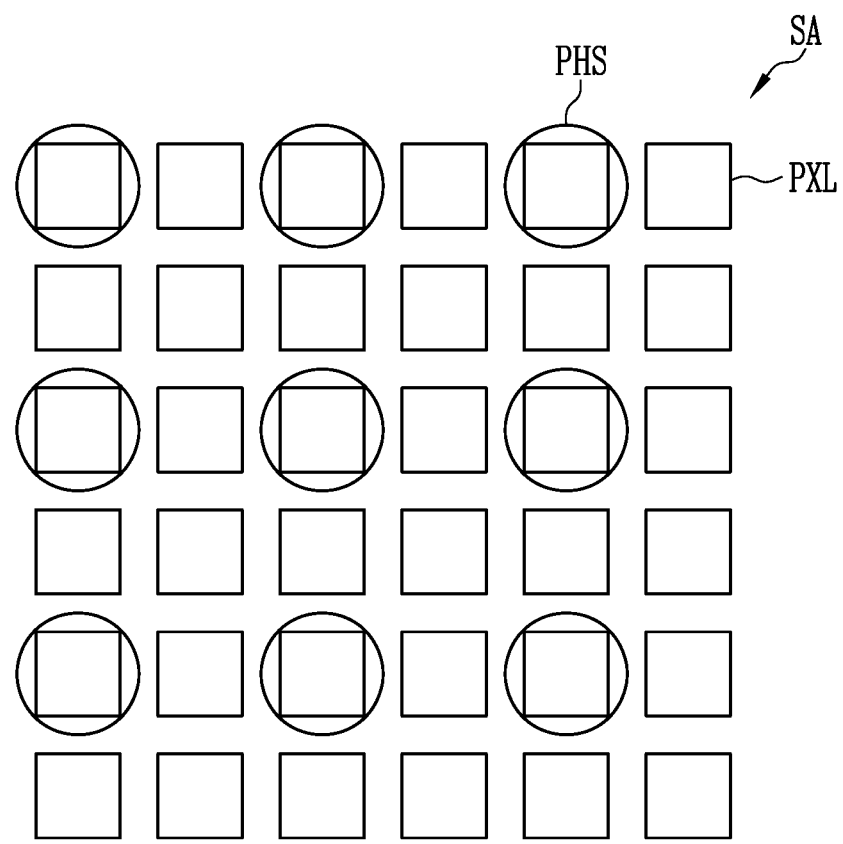
Figure 2D:
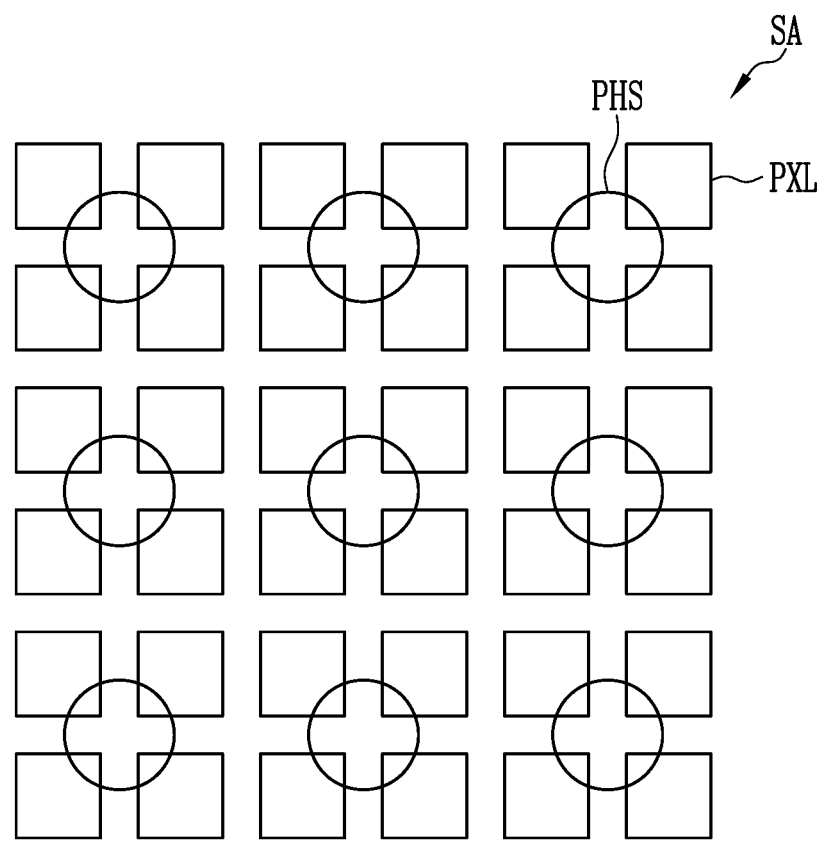
Figure 2E:
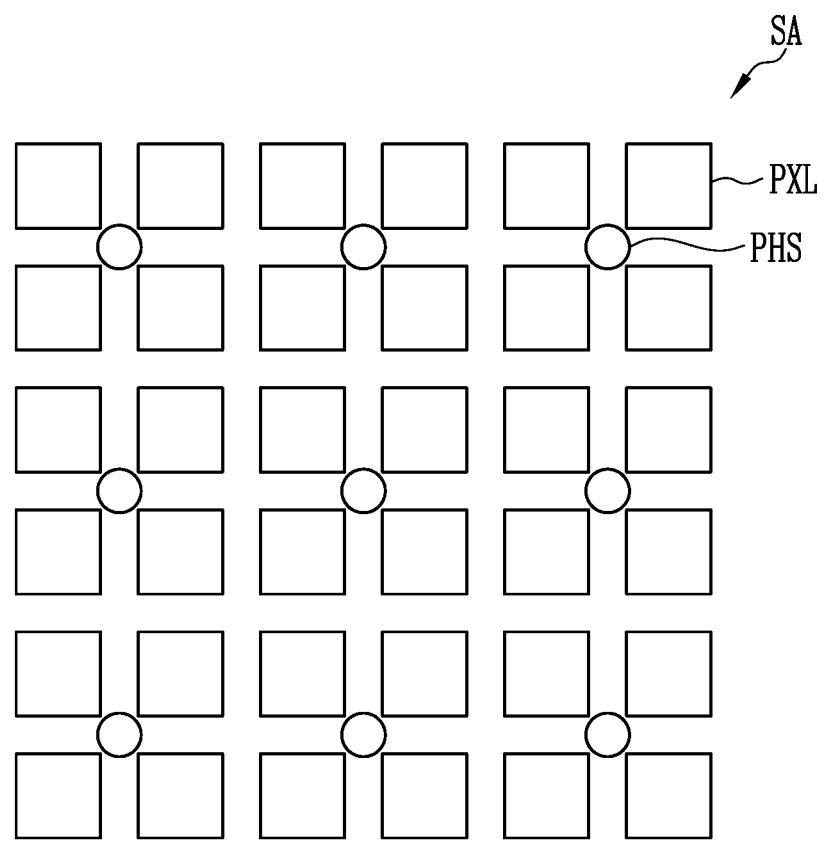

For example, the photo sensors PHS may have a smaller size than that of the pixels PXL as shown in FIGS. 2B and 2E, or the photo sensors PHS may have a larger size than that of the pixels PXL as shown in FIGS. 2C and 2D.

In some embodiments, some of or all of the photo sensors PHS may overlap with the pixels PXL. In other words, the photo sensors PHS may partially overlap with some of the pixels PXL as shown in FIGS. 2B and 2C.

In other embodiments, the photo sensors PHS may be disposed between the pixels PXL as shown in FIG. 2D to partially overlap with the pixels PXL. The photo sensors PHS may have a larger size than that of the pixels PXL as shown in FIG. 2D. For example, the photo sensors PHS may have a size that is large enough to cover at least one pixel PXL.

In still other embodiments, the photo sensors PHS may not overlap with the pixels PXL as shown in FIG. 2E.

However, the present disclosure is not limited to the examples of the arrangement structure between the pixels PXL and the photo sensors PHS described above. In other words, the shapes, arrangements, relative sizes, numbers, and/or resolutions of the pixels PXL and the photo sensors PHS at (e.g., in or on) the sensing area SA may be variously modified without departing from the spirit and scope of the present disclosure.

Figure 3:
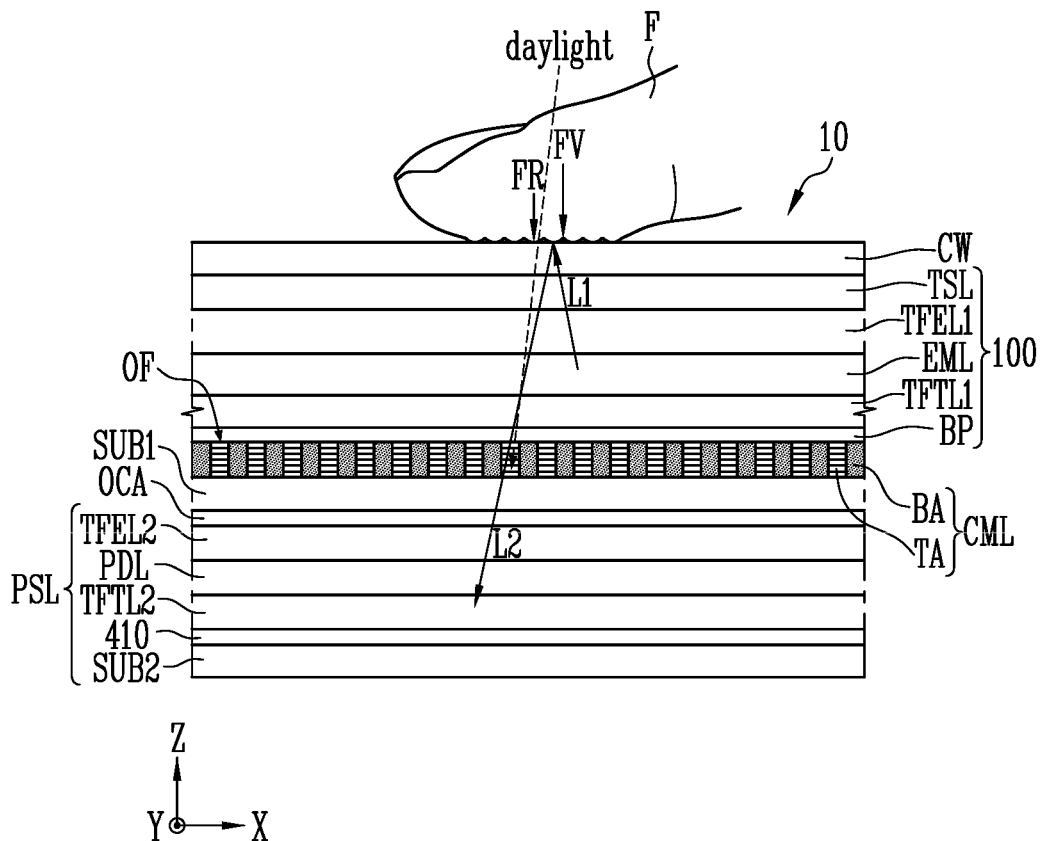
FIG. 3 is a sectional view schematically illustrating an example of the display device shown in FIG. 1.
Figure 4:
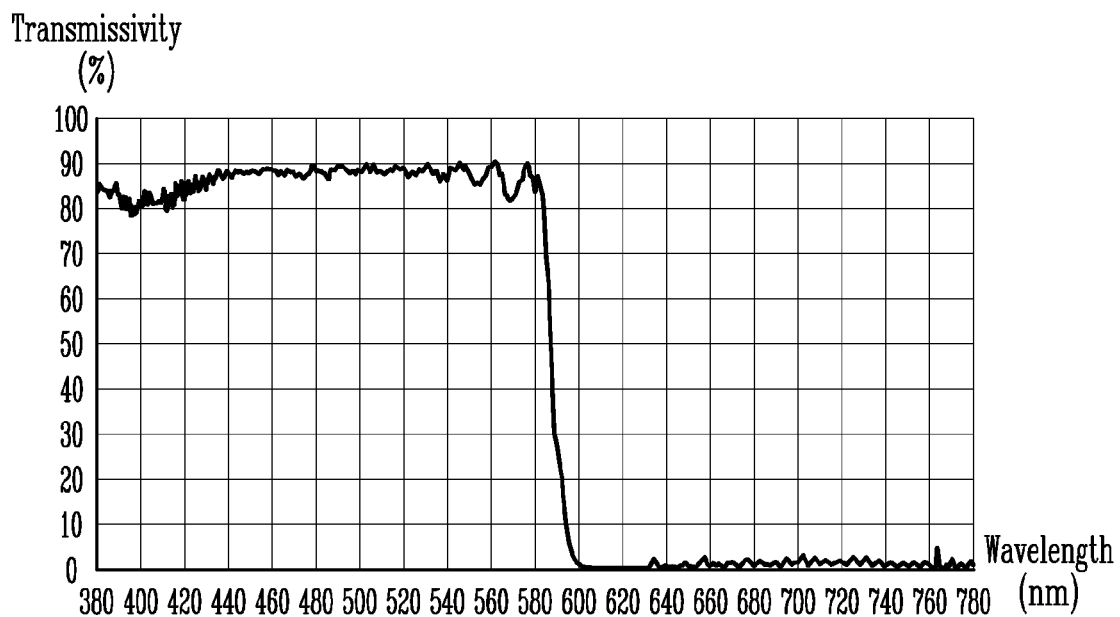
FIG. 4 is a graph illustrating an example of a light transmission characteristic of an optical filter included in the display device shown in FIG. 3.

FIG. 3 is a sectional view schematically illustrating an example of the display device shown in FIG. 1. FIG. 4 is a graph illustrating an example of a light transmission characteristic of an optical filter included in the display device shown in FIG. 3.

Referring to FIGS. 1, 3, and 4, the display device 10 may include a first substrate SUB1, an optical pattern layer CML, an optical filter OF, a display panel 100, a cover window CW, and a photo sensor layer PSL (or a photo sensor panel).

In an embodiment, the photo sensor layer PSL, the optical pattern layer CML, the display panel 100, and the cover window CW may be formed along a third direction (e.g., a Z-axis direction). For example, the photo sensor layer PSL, the optical pattern layer CML, the display panel 100, and the cover window CW may be stacked on one another in the third direction.

The first substrate SUB1 may be a base substrate. The first substrate SUB1 may include (e.g., may be made of) an insulating material, for example, such as polymer resin or ultra-thin glass (UTG). For example, the first substrate SUB1 may include (e.g., may be made of) polyethersulphone (PES), polyacrylate (PAC), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CTA), cellulose acetate propionate (CAP), or any suitable combination thereof.

For example, the first substrate SUB1 may be a flexible substrate, which may be bendable, foldable, rollable, and/or the like.

The optical pattern layer CML may be disposed on the first substrate SUB1. The optical pattern layer CML may provide a light receiving element with light reflected from a ridge FR of a finger F of a user, and light reflected from a valley FV of the finger F of the user. For example, the optical pattern layer CML may include a light blocking part (e.g., a light blocking portion) BA, and a light transmitting part (e.g., a light transmitting portion) TA corresponding to an opening penetrating (e.g., extending through) the light blocking part BA in one direction (e.g., the Z-axis direction).

The light blocking part BA may include at least one from among an organic light blocking material and a metal light blocking material. The organic light blocking material may include, for example, at least one from among carbon black (CB) and titan black (TiBK), but the present disclosure is not limited thereto. The metal light blocking material may include, for example, at least one from among chromium, chromium oxide, and chromium nitride, but the present disclosure is not limited thereto.

The light transmitting part TA may define (e.g., may be) an optical path for second light L2 advancing toward the photo sensor layer PSL. The second light L2 may be reflected light corresponding to (e.g., obtained by) first light L1 emitted from a light emitting device layer EML and reflected off a body (e.g., a finger) and/or the like of the user. Further, external light (e.g., daylight as shown in FIG. 3) transmitted through the body of the user may also be incident into the light transmitting part TA.

In an embodiment, the light transmitting part TA may not overlap with a transistor of a first transistor layer TFTL1, and the light blocking part BA may overlap with the transistor of the first transistor layer TFTL1. For example, a plurality of light transmitting parts TA may be arranged along a first direction (e.g., X-axis direction) and a second direction (e.g., Y-axis direction).

In an embodiment, the optical pattern layer CML may serve as a collimator array. For example, the light blocking part BA of the optical pattern layer CML may be disposed while forming a slit, and light incident through the light transmitting part TA may be provided in the form of parallel light (or linear light) to the photo sensor layer PSL. In other words, light components (e.g., only light components) of the light that is reflected vertically or substantially vertically (e.g., near verticality) from the finger F of the user may be incident into the photo sensor layer PSL.

The photo sensor layer PSL may sense a fingerprint and/or the like by using a luminance difference between light reflected from the ridge FR and light reflected from the valley FV of the finger F. For example, a luminance of the light reflected from the valley FV may be higher than that of the light reflected from the ridge FR. Sensing sensitivity and accuracy may become higher as the luminance difference between the light reflected from the ridge FR and the light reflected from the valley FV becomes larger.

However, when external light is transmitted through the finger F, brightness of the external light transmitted through the ridge FV of the finger F and then provided to the photo sensor layer PSL may be higher than that of the external light transmitted through the valley FV of the finger F and then provided to the photo sensor layer PSL. In this case, the external light may act as noise, which may decrease the luminance difference between the light reflected from the ridge FR and the light reflected from the valley FV.

In some embodiments, the optical filter OF may be disposed to minimize or reduce the amount of external light transmitted through the body of the user, for example such as the finger F of the user, and then provided to the photo sensor layer PSL. The optical filter OF may block transmission of light having a particular wavelength (e.g., a predetermined wavelength), such that the light having the particular wavelength is not transferred to the photo sensor layer PSL.

An optical filter structure may be formed separately from the optical pattern layer CML, and may be disposed at (e.g., in or on) a separate layer. In this case, the optical filter structure may become a factor (e.g., a main factor) that causes an increase in the thickness (e.g., in the Z-axis direction) of the display device 10, and/or a decrease in the light sensing sensitivity.

According to one or more example embodiments of the present disclosure, the optical filter OF may be disposed in the light transmitting part TA on the first substrate SUB1. In other words, in some embodiments, the light transmitting part TA may have a shape with an opening (e.g., an opening shape), and the optical filter OF may be formed to fill at least a portion of the light transmitting part TA.

In an embodiment, the optical filter OF may include at least two filter layers having different refractive indices from each other. The filter layers may be stacked (e.g., alternately stacked) on one another. The stacked structure of the filter layers having different refractive indices from each other may include (e.g., may have or may form) filter pairs. For example, the optical filter OF may include a structure in which a first filter layer having a relatively low refractive index and a second filter layer having a relatively high refractive index are disposed (e.g., alternately disposed) on one another.

Because a destructive interference with respect to a particular wavelength (e.g., a predetermined wavelength) may occur in the optical filter OF, light having the particular wavelength may not be transmitted through the optical filter OF. For example, only the external light having a wavelength of about 580 nm or more may be transmitted through the body of the user, for example, such as the finger F of the user. In this case, in an embodiment, as shown in FIG. 4, the optical filter OF may be formed to block transmission of light having a wavelength of about 580 nm or more. Accordingly, the external light transmitted through the finger F may be blocked or substantially blocked by the optical filter OF.

In some embodiments, the optical filter OF may be integrally formed at (e.g., in or on) the same layer as that of the optical pattern layer CML having a collimator array structure. In this case, a space used for arrangement of the optical filter OF, and/or a number of manufacturing processes (e.g., a number of manufacturing processing steps) may be reduced.

The display panel 100 may be disposed on the optical pattern layer CML and the optical filter OF.

The display panel 100 may include a back plane BP, the first transistor layer TFTL1, the light emitting device layer EML, a first encapsulation layer TFEL1, and a touch sensor layer TSL.

The back plane BP may be disposed on top (e.g., on a top surface) of the optical pattern layer CML and the optical filter OF to support the first transistor layer TFTL1. For example, the back plane BP may include (e.g., may be made of) an insulating material such as polymer resin or UTG. For example, the back plane BP may be a flexible substrate, which may be bendable, foldable, rollable, stretchable, and/or the like.

Although FIG. 3 illustrates a case where the optical pattern layer CML and the back plane BP are in contact (e.g., in direct contact) with each other, the present disclosure is not limited thereto, and in some embodiments, an adhesive member may be interposed between the back plane BP and the optical pattern layer CML.

The first transistor layer TFTL1 may be disposed on the back plane BP. The first transistor layer TFTL1 may include at least one thin film transistor to drive each of the pixels PXL. In other words, in some embodiments, at least some of (or each of) the pixels PXL may include at least one thin film transistor of the first transistor layer TFTL1.

The thin film transistor included in the pixel PXL may include a semiconductor layer, a gate electrode, a drain electrode, and a source electrode. The first transistor layer TFTL1 may further include, for example, scan lines, data lines, power lines, and scan control lines, which are connected to the thin film transistor of the pixel PXL. In some embodiments, the first transistor layer TFTL1 may further include routing lines to connect pads and the data lines to each other.

The light emitting device layer EML may be disposed on the first transistor layer TFTL1. The light emitting device layer EML may include a light emitting device connected to the at least one thin film transistor of the first transistor layer TFTL1.

In an embodiment, the light emitting device may include a first electrode, a light emitting layer, and a second electrode. For example, in some embodiments, the light emitting layer may be an organic light emitting layer including (e.g., made of) an organic material, but the present disclosure is not limited thereto. For example, in other embodiments, the light emitting device may be an inorganic light emitting device, such as a micro light emitting diode (LED) or a nano LED.

The first encapsulation layer TFEL1 may be disposed on the light emitting device layer EML to cover the first transistor layer TFTL1 and the light emitting device layer EML.

The first encapsulation layer TFEL1 may prevent or substantially prevent oxygen and/or moisture from penetrating into the light emitting device layer EML. In some embodiments, the first encapsulation layer TFEL1 may include at least one inorganic layer. For example, the first encapsulation layer TFEL1 may include an inorganic layer including an inorganic material, such as silicon nitride (SiNx), silicon oxynitride (SiON), silicon oxide (SiOx), titanium oxide (TiOx), aluminum oxide (AlOx), and/or the like, but the present disclosure is not limited thereto.

The first encapsulation layer TFEL1 may protect the light emitting device layer EML from a foreign substance, for example, such as dust. In some embodiments, the first encapsulation layer TFEL1 may include at least one organic layer. For example, the first encapsulation layer TFEL1 may include an organic layer, such as acryl resin, epoxy resin, phenolic resin, polyamide resin, polyimide resin, and/or the like, but the present disclosure is not limited thereto.

In an embodiment, the first encapsulation layer TFEL1 may have a structure in which at least one organic layer and at least one inorganic layer are alternately disposed. For example, in some embodiments, the first encapsulation layer TFEL1 may include at least one organic layer and at least one inorganic layer that are stacked on one another.

The touch sensor layer TSL may be disposed on top (e.g., on a top surface) of the first encapsulation layer TFEL1. The touch sensor layer TSL may be disposed (e.g., may be directly disposed) on the top surface of the first encapsulation layer TFEL1, so that a thickness of the display device 10 may be reduced when compared to a display device including a separate touch panel including the touch sensor layer TSL that is attached onto the first encapsulation layer TFEL1. However, the present disclosure is not limited thereto, and the touch sensor layer TSL may be disposed on a bottom (e.g., a bottom surface) of the first encapsulation layer TFEL1 (e.g., in an in-cell type).

The touch sensor layer TSL may include touch electrodes for sensing a touch of a user, and touch electrode lines to connect pads and the touch electrodes to each other. The touch electrodes of the touch sensor layer TSL may be disposed at (e.g., in or on) a touch sensing area overlapping with the display area AA.

The cover window CW may be disposed on the display panel 100. In some embodiments, the cover window CW may be disposed on the touch sensor layer TSL. For example, the cover window CW may be attached onto the touch sensor layer TSL by a transparent adhesive member. The cover window may be in contact (e.g., in direct contact) with the finger F of the user.

The photo sensor layer PSL may be disposed on a bottom (e.g., a bottom surface) of the first substrate SUB1. For example, in some embodiments, a top surface (or one surface) of the first substrate SUB1 may face the optical pattern layer CML and the optical filter OF, and a bottom surface (or the other surface) of the first substrate SUB1 may face the photo sensor layer PSL.

A top surface of the photo sensor layer PSL may be attached to the bottom surface of the first substrate SUB1 by an adhesive member OCA. The adhesive member OCA may be a transparent optically clear adhesive, but the present disclosure is not limited thereto.

The photo sensor layer PSL may include a plurality of photo sensors (e.g., PHS in FIG. 1). For example, the photo sensor may include (e.g., may be configured with) a photo diode, a CMOS image sensor, a CCD camera, a photo transistor, and/or the like, but the present disclosure is not limited thereto.

The photo sensor may recognize a fingerprint by sensing light reflected by the valley FV between the ridges FR of the finger F.

For example, when the finger F of the user is in contact with the cover window CW, the first light L1 emitted from the light emitting device layer EML may be reflected by the ridge FR and/or the valley FV of the finger F, and the reflected second light L2 may reach the photo sensor layer PSL disposed on the bottom surface of the first substrate SUB1 by passing through the optical filter OF. The photo sensors (e.g., which may be fingerprint sensors) of the photo sensor layer PSL may recognize a pattern of the fingerprint of the user according to (e.g., based on) the luminance difference between the light reflected from the ridge FR and the light reflected from the valley FV. The optical filter OF may block or substantially block transmission of light having a wavelength of about 580 nm or more. Therefore, external light may not reach the photo sensor layer PSL.

The photo sensor layer PSL may include a second substrate SUB2, a buffer layer 410, a second transistor layer TFTL2, a light receiving element layer PDL, and a second encapsulation layer TFEL2.

The second substrate SUB2 may be a base substrate, and may include (e.g., may be made of) an insulating material, for example, such as polymer resin or UTG. For example, the second substrate SUB2 may be a flexible substrate, which may be bendable, foldable, rollable, and/or the like.

The buffer layer 410 may be disposed on the second substrate SUB2. The buffer layer 410 may include (e.g., may be configured with) an inorganic layer, which may prevent or substantially prevent penetration of air and/or moisture. For example, the buffer layer 410 may include (e.g., may be configured with) a multi-layered structure in which one or more inorganic layers including an inorganic material such as silicon nitride (SiNx), silicon oxynitride (SiON), silicon oxide (SiOx), titanium oxide (TiOx), aluminum oxide (AlOx), and/or the like are alternately stacked on one another, but the present disclosure is not limited thereto. In some embodiments, the buffer layer 410 may be omitted.

The second transistor layer TFTL2 may be disposed on the second substrate SUB2 or on the buffer layer 410. For example, a bottom surface of the second transistor layer TFTL2 may face a top surface of the buffer layer 410.

The second transistor layer TFTL2 may include at least one thin film transistor to drive the photo sensor PHS. In other words, in some embodiments, at least some of (or each of) the photo sensors PHS may include at least one thin film transistor of the second transistor layer TFTL2. The at least one thin film transistor of the photo sensor PHS may include a semiconductor layer, a gate electrode, a drain electrode, and a source electrode. The second transistor layer TFTL2 may further include, for example, scan lines, readout lines, and common voltage lines, which are connected to the at least one thin film transistor of the photo sensor PHS.

In an embodiment, the light receiving element layer PDL may be disposed on the second transistor layer TFTL2. A bottom surface of the light receiving element layer PDL may face a top surface of the second transistor layer TFTL2.

The second encapsulation layer TFEL2 may be disposed on the light receiving element layer PDL. A bottom surface of the second encapsulation layer TFEL2 may face a top surface of the light receiving element layer PDL.

The second encapsulation layer TFEL2 may cover the top surface of the light receiving element layer PDL. In an embodiment, the second encapsulation layer TFEL2 may include at least one inorganic layer and at least one organic layer. For example, the second encapsulation layer TFEL2 may include the same or substantially the same (e.g., or similar) material and/or structure as those of the first encapsulation layer TFEL1.

Figure 5:
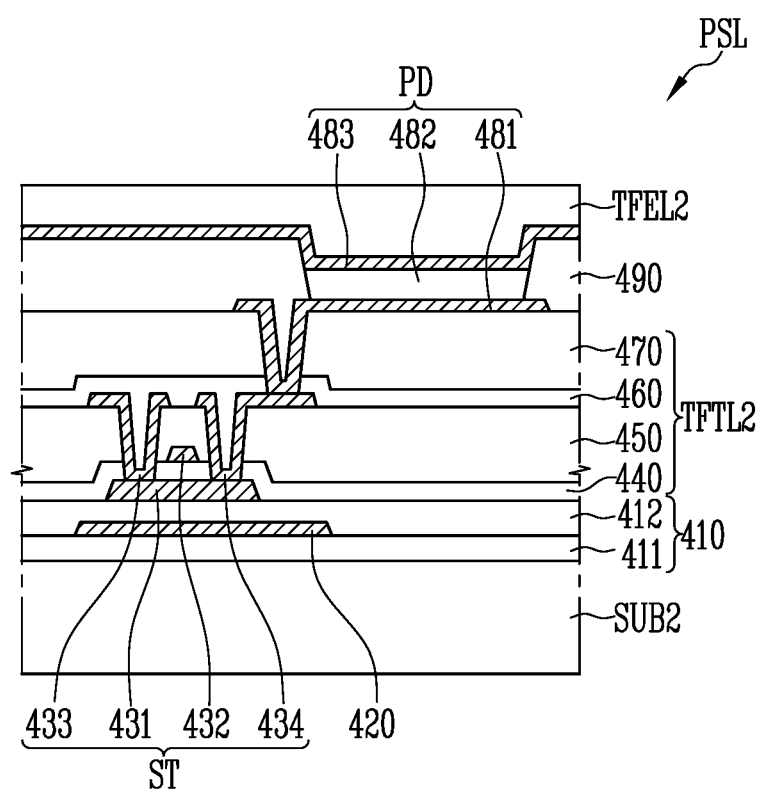
FIG. 5 is a sectional view illustrating an example of a photo sensor layer included in the display device shown in FIG. 3.

FIG. 5 is a sectional view illustrating an example of the photo sensor layer included in the display device shown in FIG. 3.

Referring to FIGS. 3 and 5, the photo sensor layer PSL may include a second substrate SUB2, a buffer layer 410, a second transistor layer TFTL2, a light receiving element layer, and a second encapsulation layer TFEL2.

In an embodiment, the buffer layer 410 may include a first buffer layer 411 and a second buffer layer 412. The first buffer layer 411 may include (e.g., may be configured with) an inorganic layer, which may prevent or substantially prevent penetration of air and/or moisture. The second buffer layer 412 may be disposed on the first buffer layer 411, and may cover a light blocking pattern 420, which may be patterned on the first buffer layer 411. The second buffer layer 412 may include (e.g., may be configured with) an inorganic layer, which may prevent or substantially prevent penetration of air and/or moisture.

In an embodiment, the light blocking pattern 420 may be disposed between the first and second buffer layers 411 and 412 to overlap with a switching transistor ST. For example, the light blocking pattern 420 may be formed by depositing a light absorbing material or a light blocking material on the first buffer layer 411, and then performing exposure patterning thereof. The light blocking pattern 420 may include (e.g., may be made of) one or more suitable metals, for example, such as molybdenum (Mo), aluminum (Al), chromium (Cr), silver (Ag), and/or the like, or alloys thereof, but the present disclosure is not limited thereto.

The second transistor layer TFTL2 may be provided on the buffer layer 410. The second transistor layer TFTL2 may include the switching transistor ST, which drives the photo sensor (e.g., each photo sensor) PHS. The second transistor layer TFTL2 may further include a gate insulating layer 440, an interlayer insulating layer 450, a protective layer 460, and a planarization layer 470. The switching transistor ST may include a semiconductor layer 431, a gate electrode 432, a source electrode 433, and a drain electrode 434.

The semiconductor layer 431 may be provided on the buffer layer 410. The semiconductor layer 431 may be disposed to overlap with the gate electrode 432, the source electrode 433, and the drain electrode 434. The semiconductor layer 431 may be in contact (e.g., in direct contact) with the source electrode 433 and the drain electrode 434, and may face the gate electrode 432 with the gate insulating layer 440 interposed therebetween.

The gate electrode 432 may be disposed on the gate insulating layer 440. The gate electrode 432 may overlap with the semiconductor layer 431 with the gate insulating layer 440 interposed therebetween.

The source electrode 433 and the drain electrode 434 may be disposed on the interlayer insulating layer 450 to be spaced apart from each other. The source electrode 433 may be in contact with one side (e.g., a left side in FIG. 5) of the semiconductor layer 431 through a first contact hole provided in (e.g., extending through or passing through) the gate insulating layer 440 and the interlayer insulating layer 450. The drain electrode 434 may be in contact with another side (e.g., a right side in FIG. 5) of the semiconductor layer 431 through a second contact hole provided in (e.g., extending through or passing through) the gate insulating layer 440 and the interlayer insulating layer 450. The drain electrode 434 may be in contact (e.g., in direct contact) with a first electrode 481 of a light receiving element PD of the light receiving element layer through a third contact hole provided in (e.g., extending through or passing through) the protective layer 460.

The gate insulating layer 440 may be provided over the semiconductor layer 431. For example, the gate insulating layer 440 may be provided on the semiconductor layer 431 and the buffer layer 410, and may insulate the semiconductor layer 431 and the gate electrode 432 from each other. The gate insulating layer 440 may include the first contact hole through which the source electrode 433 penetrates, and the second contact hole through which the drain electrode 434 penetrates.

The interlayer insulating layer 450 may be disposed over the gate electrode 432. For example, the interlayer insulating layer 450 may include the first contact hole through which the source electrode 433 penetrates, and the second contact hole through which the drain electrode 434 penetrates. The first contact hole and the second contact hole of the interlayer insulating layer 450 may be connected to the first contact hole and the second contact hole of the gate insulating layer 440, respectively.

The protective layer 460 may be provided over the switching transistor ST to protect the switching transistor ST. For example, the protective layer 460 may include the third contact hole through which the first electrode 481 of the light receiving element PD penetrates.

The planarization layer 470 may be provided on the protective layer 460 to planarize or substantially planarize a top surface of the switching transistor ST. The planarization layer 470 may include the third contact hole through which the first electrode 481 of the light receiving element PD penetrates. The third contact hole of the protective layer 460 and the third contact hole of the planarization layer 470 may be connected to each other to allow the first electrode 481 of the light receiving element PD to penetrate therethrough.

The light receiving element layer (e.g., PDL shown in FIG. 3) may be provided on the second transistor layer TFTL2. The light receiving element layer PDL may include the light receiving element PD connected to the switching transistor ST of the second transistor layer TFTL2, and a sensor defining layer 490 surrounding (e.g., around a periphery of) the light receiving element PD.

The light receiving element PD may include the first electrode 481, a light receiving layer 482, and a second electrode 483.

The first electrode 481 may be provided on the planarization layer 470. For example, the first electrode 481 may be disposed to overlap with an opening area of the light receiving element layer PDL, which is defined by the sensor defining layer 490. The first electrode 481 may be in contact with the drain electrode 434 of the switching transistor ST through the third contact hole provided in the planarization layer 470 and the protective layer 460. For example, the first electrode 481 may include (e.g., may be made of) a transparent conductive material to allow the second light L2 reflected by the finger F to be transmitted therethrough, and may serve as an anode of the light receiving element PD.

The light receiving layer 482 may be provided on the first electrode 481. The light receiving layer 482 may be an organic light receiving layer including (e.g., made of) an organic material, but the present disclosure is not limited thereto.

The second electrode 483 may be provided on the light receiving layer 482. For example, the second electrode 483 may not be divided for each photo sensor PHS, and may be implemented in the form of an electrode that is commonly provided to all the photo sensors PHS.

The sensor defining layer 490 of the light receiving element layer PDL may be provided on the planarization layer 470. The sensor defining layer 490 may be provided between adjacent first electrodes 481 of adjacent light receiving elements PD to define a plurality of first electrodes 481. The sensor defining layer 490 may define the opening area of the light receiving element layer PDL by electrically insulating the adjacent first electrodes 481 and the light receiving layer 482 from each other.

The second encapsulation layer TFTL2 may be provided on the light receiving element layer PDL.

Figure 6:
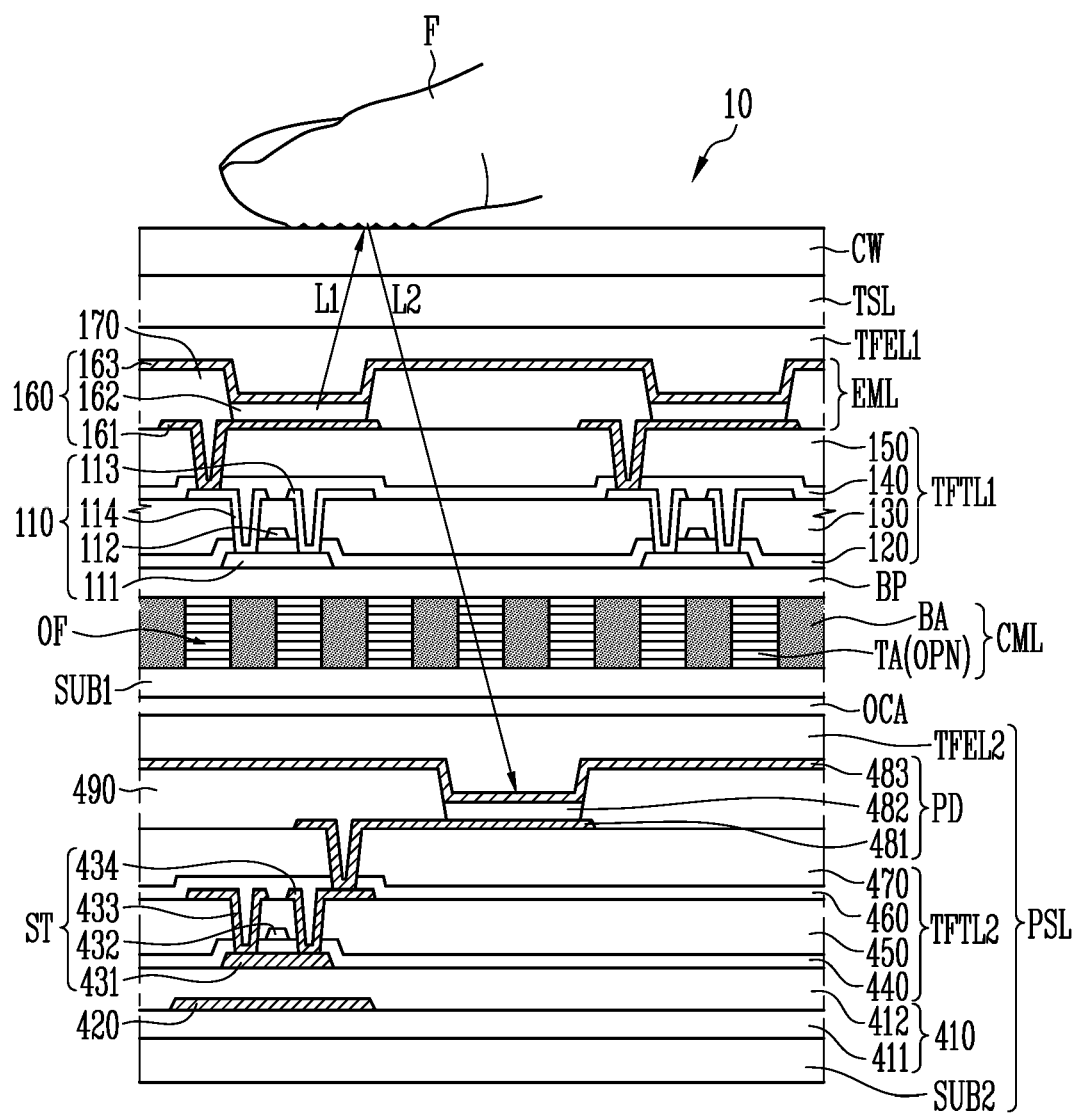
FIG. 6 is a sectional view illustrating an example of the display device shown in FIG. 3.

FIG. 6 is a sectional view illustrating an example of the display device shown in FIG. 3.

FIG. 6 is a sectional view illustrating in more detail some of the components of the display device shown in FIG. 3, and redundant description of the components thereof that are the same or substantially the same as those described with reference to FIGS. 3 and 5 may be simplified or may not be repeated.

Referring to FIGS. 3, 5, and 6, the display device 10 may include a first substrate SUB1, an optical pattern layer CML, an optical filter OF, a display panel 100, a cover window CW, and a photo sensor layer PSL.

The optical pattern layer CML may be disposed on the first substrate SUB1. The optical pattern layer CML may include a light blocking part (e.g., a light blocking portion) BA, and a light transmitting part (e.g., a light transmitting portion) TA corresponding to an opening OPN that penetrates the light blocking part BA in one direction.

In an embodiment, the optical filter OF may be disposed in the light transmitting part TA on the first substrate SUB1. In other words, the optical filter OF may be formed to fill at least a portion of the light transmitting part TA having a shape with an opening (e.g., an opening shape).

A first transistor layer TFTL1 including at least one thin film transistor 110 may be disposed on a back plane BP.

The first transistor layer TFTL1 may further include a gate insulating layer 120, an interlayer insulating layer 130, a protective layer 140, and a planarization layer 150.

The at least one thin film transistor 110 may include a semiconductor layer 111, a gate electrode 112, a source electrode 113, and a drain electrode 114.

The semiconductor layer 111 may be provided on the back plane BP. The semiconductor layer 111 may be disposed to overlap with the gate electrode 112, the source electrode 113, and the drain electrode 114. The semiconductor layer 111 may be in contact (e.g., in direct contact) with the source electrode 113 and the drain electrode 114, and may face the gate electrode 112 with the gate insulating layer 120 interposed therebetween.

The gate electrode 112 may be disposed on (e.g., on top of) the gate insulating layer 120. The gate electrode 112 may overlap with the semiconductor layer 111 with the gate insulating layer 120 interposed therebetween.

The source electrode 113 and the drain electrode 114 may be disposed on the interlayer insulating layer 130 to be spaced apart from each other. The source electrode 113 may be in contact with one side (e.g., a right side in FIG. 6) of the semiconductor layer 111 through a contact hole provided in the gate insulating layer 120 and the interlayer insulating layer 130. The drain electrode 114 may be in contact with another side (e.g., a left side in FIG. 6) of the semiconductor layer 111 through a contact hole provided in the gate insulating layer 120 and the interlayer insulating layer 130. The drain electrode 114 may be in contact (e.g., in direct contact) with a first electrode 161 of a light emitting device 160 through a contact hole of the protective layer 140.

The gate insulating layer 120 may be provided over (e.g., to cover) the semiconductor layer 111. The interlayer insulating layer 130 may be disposed over (e.g., to cover) the gate electrode 112. The protective layer 140 may be provided over (e.g., to cover) the thin film transistor 110 to protect the thin film transistor 110. The planarization layer 150 may be provided on the protective layer 140 to planarize a top surface of the thin film transistor 110.

A light emitting device layer EML may be provided on the first transistor layer TFTL1. The light emitting device layer EML may include the light emitting device 160 connected to the thin film transistor 110 of the first transistor layer TFTL1.

The light emitting device 160 may include the first electrode 161, a light emitting layer 162, and a second electrode 163.

The first electrode 161 may be provided on the planarization layer 150. For example, the first electrode 161 may be disposed to overlap with an opening area of the light emitting device layer EML, which may be defined by a pixel defining layer 170. The first electrode 161 may be connected to the drain electrode 114 of the thin film transistor 110 through a contact hole provided in the planarization layer 150 and the protective layer 140. For example, the first electrode 161 may serve as an anode of the light emitting device 160.

The light emitting layer 162 may be provided on the first electrode 161. The light emitting layer 162 may include a hole injection layer, a hole transport layer, a light receiving layer, an electron stop layer, an electron transport layer, an electron injection layer, and/or the like. For example, the light emitting layer 162 may be an organic light emitting layer including (e.g., made of) an organic material, but the present disclosure is not limited thereto.

The second electrode 163 may be provided on the light emitting layer 162.

The light emitting device layer EML may include the pixel defining layer 170, which defines a plurality of sub-pixels. The first electrode 161 and the of the light emitting layer 162 of a first sub-pixel may be spaced apart and insulated from the first electrode 161 and the of the light emitting layer 162 of a second sub-pixel by the pixel defining layer 170.

In some embodiments, the display device 10 further includes a first encapsulation layer TFEL1, a touch sensor layer TSL, a cover window CW, and the photo sensor layer PSL, which may be the same or substantially the same as those described with reference to FIGS. 3 and 5, and therefore, redundant description thereof may not be repeated.

Figure 7:
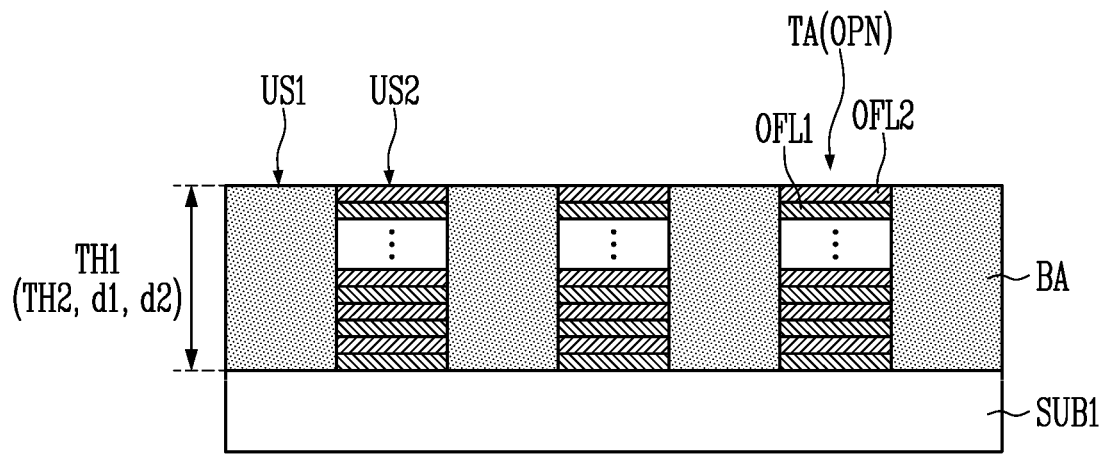
FIG. 7 is a sectional view illustrating an example of an optical pattern layer and the optical filter included in the display device shown in FIG. 3.

FIG. 7 is a sectional view illustrating an example of the optical pattern layer and the optical filter included in the display device shown in FIG. 3.

In FIG. 7, components that are the same or substantially the same as those described with reference to FIG. 3 are designated by like reference symbols, and thus, redundant description thereof may not be repeated.

Referring to FIGS. 3 and 7, the optical pattern layer CML and the optical filter OF may be disposed on the first substrate SUB1.

The optical pattern layer CML may include the light blocking part BA, and the light transmitting part corresponding to the opening OPN penetrating the light blocking part BA in one direction. In an embodiment, the optical pattern layer CML may be formed to have a collimator array structure. The light blocking part BA may include at least one from among an organic light blocking material and a metal light blocking material.

The optical filter OF may be disposed in the light transmitting part TA of the optical pattern layer CML. In an embodiment, the optical filter OF may include a first filter layer OFL1 having a first refractive index, and a second filter layer OFL2 having a second refractive index. For example, in some embodiments, the optical filter OF may include a plurality of first filter layers OFL1 and a plurality of second filter layers OFL2.

The first filter layers OFL1 and the second filter layers OFL2 may be alternately disposed on one another. For a non-limiting example, in an embodiment, each of the first filter layers OFL1 and the second filter layers OFL2 may be alternately stacked on one another in eight layers or more. For example, the first filter layers OFL1 and the second filter layers OFL2, which may form 10 to 40 pairs, may be alternately stacked on one another to constitute a stacked structure. However, the present disclosure is not limited thereto, and the stack structure of the first filter layers OFL1 and the second filter layers OFL2 may have any suitable structure. For example, in some embodiments, the optical filter OF may further include at least one filter layer having a refractive index different from those of the first filter layer OFL1 and the second filter layer OFL2.

A side surface of each of the first filter layer OFL1 and the second filter layer OFL2 may be in contact (e.g., in direct contact) with a side surface of the light blocking part BA. In some embodiments, light scattered toward the side surface of the light blocking part BA in the first filter layer OFL1 and the second filter layer OFL2 may be absorbed into the light blocking part BA.

Each of the first filter layer OFL1 and the second filter layer OFL2 may block or substantially block transmission of light having a particular wavelength (e.g., predetermined wavelength) value or more. For example, in an embodiment, each of the first filter layer OFL1 and the second filter layer OFL2 may block or substantially block light having a wavelength of about 580 nm or more from being transmitted through the photo sensor layer PSL. For example, a light component having a wavelength of 580 nm or more may be destructively interfered with (or scattered) through the first filter layer OFL1 and the second filter layer OFL2. In this case, the light component having the wavelength of 580 nm or more is destructively interfered with while passing through the first filter layer OFL1 and the second filter layer OFL2, and thus, may not reach the photo sensor layer PSL.

The first refractive index and the second refractive index may be different from each other. In a non-limiting embodiment, the difference between the first refractive index and the second refractive index may be greater than 0.3. For example, in an embodiment, the first refractive index may be about 1.7 or less, and the second refractive index may be about 2.1 or more.

However, the present disclosure is not limited thereto, and the difference between the first refractive index and the second refractive index may be various modified. For example, a number of the stacked first and second filter layers OFL1 and OFL2 may be increased as the difference between the first refractive index and the second refractive index is decreased.

In an embodiment, the first filter layer OFL1 and the second filter layer OFL2 may include different inorganic materials from each other. For example, the first filter layer OFL1 may include silicon oxide, and the second filter layer OFL2 may include titanium oxide.

In this case, the difference between refractive indices of silicon oxide and titanium oxide may be 0.5 or more. However, the present disclosure is not limited thereto, and the configuration, structure, and/or materials of the first filter layer OFL1 and the second filter layer OFL2 may be variously modified. For example, at least one of the first filter layer OFL1 and the second filter layer OFL2 may include an organic material such as PET.

A thickness TH2 (e.g., in the Z-axis direction) of the optical filter OF may be less than or equal to (or substantially equal to) a thickness TH1 (e.g., in the Z-axis direction) of the light blocking part BA. For example, the thickness TH1 of the light blocking part BA may be about 250 μm or less.

In an embodiment, as shown in FIG. 7, the thickness TH2 of the optical filter OF and the thickness TH1 of the light blocking part BA may be the same or substantially the same. Further, a distance d2 between a top surface US2 of the optical filter OF and the first substrate SUB1 may be equal to or substantially equal to a distance d1 between a top surface US1 of the light blocking part BA and the first substrate SUB1.

According to one or more example embodiments of the present disclosure described above, the optical filter OF may not be formed higher than the light blocking part BA. Thus, the total thickness of the optical pattern layer CML having the collimator array structure and the optical filter OF may be reduced (e.g., may be formed to be very thin). Further, the optical filter OF, which may be a part or a film separate from the optical pattern layer CML in a comparative example, may be integrally formed with the optical pattern layer CML according to one or more example embodiments of the present disclosure, so that a space and/or a manufacturing process for an arrangement of the optical filter OF may be reduced.

Figure 8:
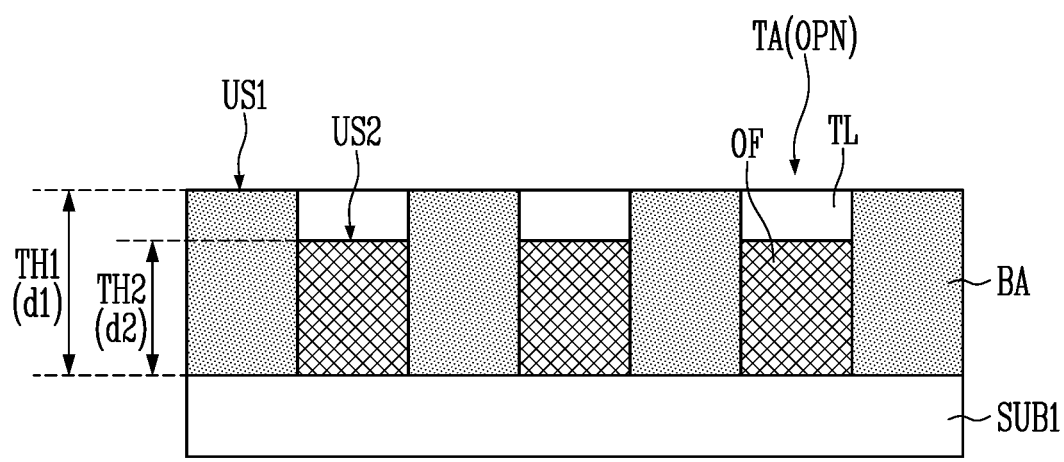
FIG. 8 is a sectional view illustrating another example of the optical pattern layer and the optical filter included in the display device shown in FIG. 3.
Figure 9:
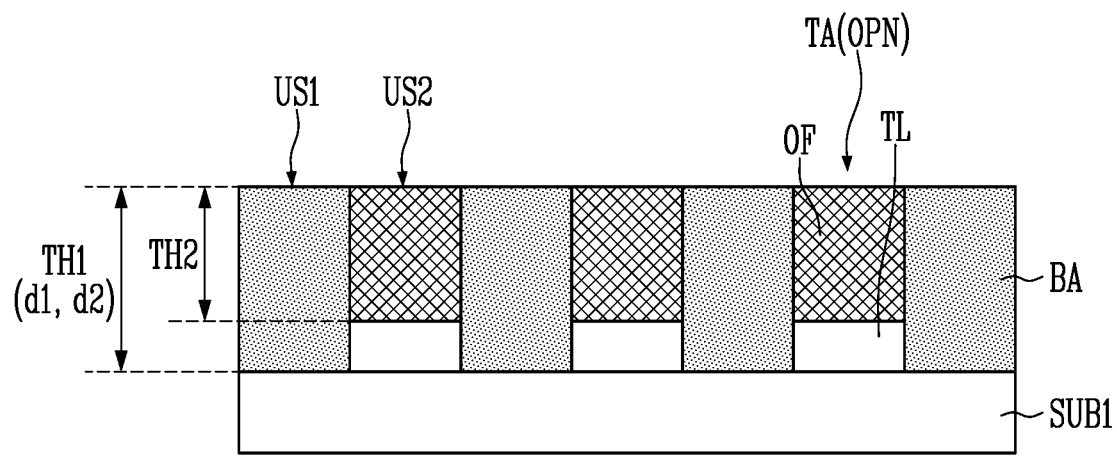
FIG. 9 is a sectional view illustrating another example of the optical pattern layer and the optical filter included in the display device shown in FIG. 3.
Figure 10:
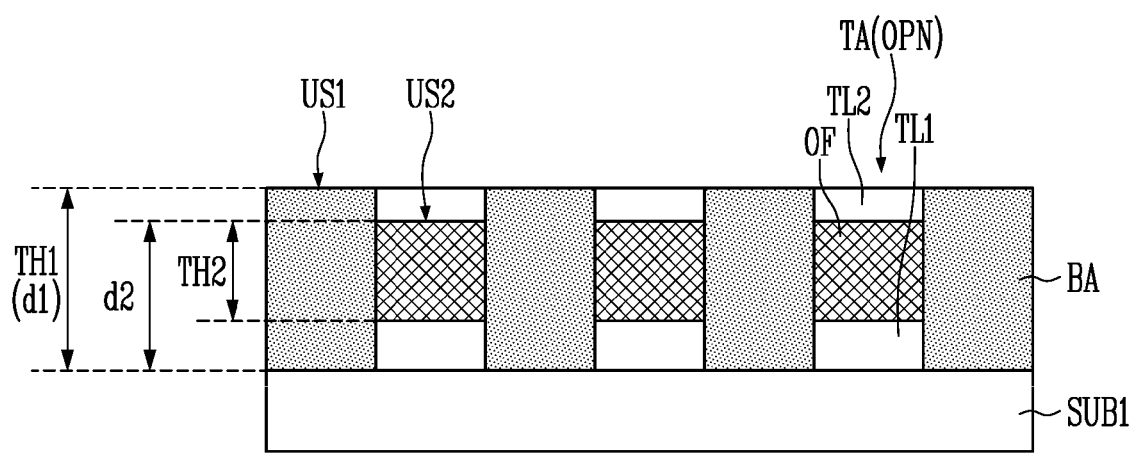
FIG. 10 is a sectional view illustrating another example of the optical pattern layer and the optical filter included in the display device shown in FIG. 3.

FIG. 8 is a sectional view illustrating another example of the optical pattern layer and the optical filter included in the display device shown in FIG. 3. FIG. 9 is a sectional view illustrating another example of the optical pattern layer and the optical filter included in the display device shown in FIG. 3. FIG. 10 is a sectional view illustrating another example of the optical pattern layer and the optical filter included in the display device shown in FIG. 3.

In FIGS. 8 to 10, the same or substantially the same components as those described with reference to FIG. 7 are designated by like reference symbols, and thus, redundant description thereof may not be repeated.

Referring to FIGS. 8 to 10, the optical pattern layer CML and the optical filter OF may be disposed on the first substrate SUB1.

In some embodiments, a transparent layer TL may be included (e.g., may be filled) in the light transmitting part TA, and may be disposed at least at (e.g., in or on) one from among an upper portion (e.g., an upper surface) and a lower portion (e.g., a lower surface) of the optical filter OF. The transparent layer TL may include an organic transparent material. However, the present disclosure is not limited thereto, and the transparent layer TL may include any suitable transparent material.

In an embodiment, a thickness TH2 of the optical filter OF may be less than a thickness TH1 of the light blocking part BA. In this case, an empty space may be formed in the light transmitting part TA. The transparent layer TL may be used to filled in the empty space.

In an embodiment, as shown in FIG. 8, the transparent layer TL may be disposed at the upper portion (e.g., the upper surface) of the optical filter OF. A top surface of the light transmitting part TA and the top surface US1 of the light blocking part BA may be planarized or substantially planarized by the transparent layer TL. A distance d2 between the top surface US2 of the optical filter OF and the first substrate SUB1 may be less than the distance d1 between the top surface US1 of the light blocking part BA and the first substrate SUB1.

In an embodiment, as shown in FIG. 9, the transparent layer TL may be disposed at the lower portion (e.g., the lower surface) of the optical filter OF. The top surface US2 of the optical filter OF and the top surface US1 of the light blocking part BA may be planarized or substantially planarized by the transparent layer TL. A distance d2 between the top surface US2 of the optical filter OF and the first substrate SUB1 may be equal to or substantially equal to the distance d1 between the top surface US1 of the light blocking part BA and the first substrate SUB1.

In an embodiment, as shown in FIG. 10, a plurality of transparent layers TL1 and TL2 may be disposed at the lower portion (e.g., the lower surface) and the upper portion (e.g., the upper surface) of the optical filter OF, respectively. The top surface of the light transmitting part TA and the top surface US1 of the light blocking part BA may be planarized or substantially planarized by the transparent layers TL1 and TL2. A distance d2 between the top surface US2 of the optical filter OF and the first substrate SUB1 may be less than the distance d1 between the top surface US1 of the light blocking part BA and the first substrate SUB1.

According to one or more example embodiments of the present disclosure described above, the optical filter OF, which may be a separate part or a separate film from the optical pattern layer CML in a comparative example, may be integrally formed in the light transmitting part TA of the optical pattern layer CML, so that the total thickness of the optical pattern layer CML having the collimator array structure and the optical filter OF may be reduced (e.g., may be considerably reduced).

FIGS. 11A to 11H are sectional views illustrating a method of manufacturing a display device in accordance with one or more example embodiments of the present disclosure.

FIGS. 11A to 11H are sectional views illustrating a method of manufacturing a display device including at least one of the configurations shown in FIGS. 3, 5, 7, 8, 9, and 10. In FIGS. 11A to 11H, components that are the same or substantially the same as those shown in FIGS. 3, 5, 7, 8, 9, and 10 are designated by like reference symbols, and thus, redundant description thereof may not be repeated.

Referring to FIGS. 11A to 11H, in brief overview, the method may include coating a light blocking material BAM on a first substrate SUB1, and forming an optical pattern layer CML including a light blocking part (e.g., a lock blocking portion) BA and a light transmitting part (e.g., a light transmitting portion) TA by patterning the light blocking material BAM. The method may further include alternately stacking, at (e.g., in or on) the optical pattern layer CML and the first substrate SUB1, a first filter layer OFL1 having a first refractive index and a second filter layer OFL2 having a second refractive index, and forming an optical filter OF by repeatedly stacking the first filter layer OFL1 and the second filter layer OFL2. The method may further include polishing a top surface of the optical filter OF, and providing a display panel 100 including a light emitting device layer EML on the first substrate SUB1 on which the optical pattern layer CML and the optical filter OF are formed.

Figure 11A:
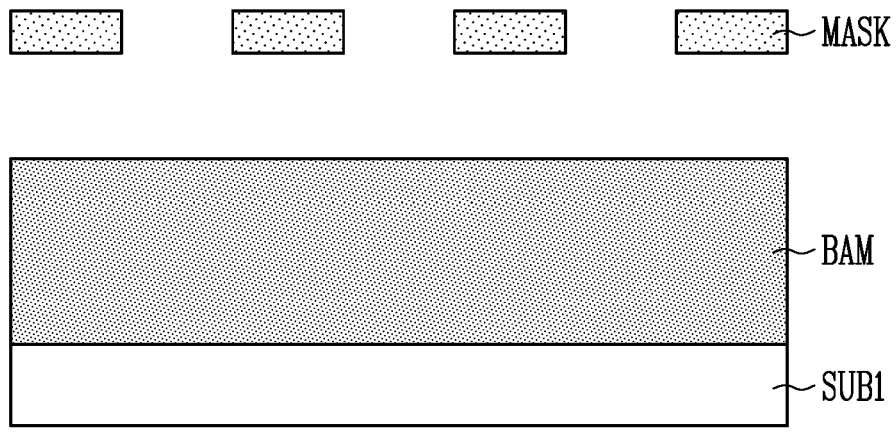
FIGS. 11A-11H are sectional views illustrating a method of manufacturing a display device in accordance with one or more example embodiments of the present disclosure.

In more detail, as shown in FIG. 11A, the light blocking material BAM may be coated on the first substrate SUB1. The coated light blocking material BAM may be patterned.

The first substrate SUB1 may include (e.g., may be) a thin film glass, and may have any suitable or desired thickness (e.g., a thickness of a few tens of micrometers (μm) or less). The light blocking material BAM may include at least one from among an organic light blocking material and a metal blocking material. For example, the light blocking material BAM may include a material that is the same or substantially the same as (or similar to) that of the pixel defining layer 170 (e.g., see FIG. 6).

The light blocking material BAM may be formed on the first substrate SUB1 through a spray process, a spin coating process, a roll printing process, a nozzle printing process, an inkjet printing process, or the like.

Figure 11B:
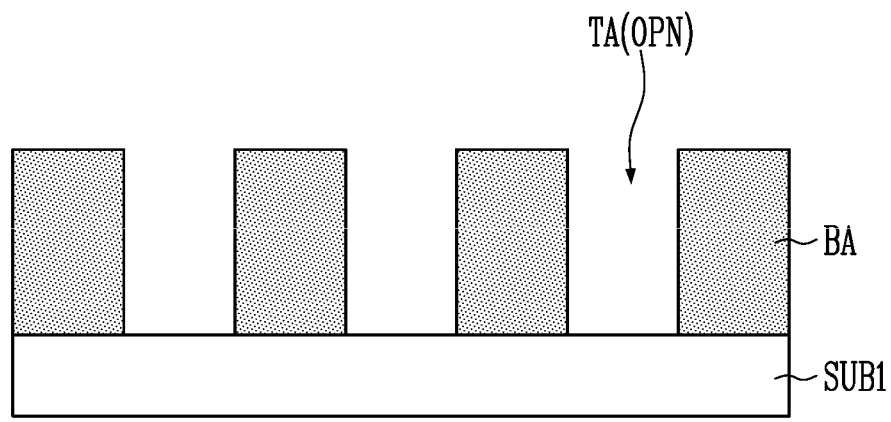

As shown in FIGS. 11A and 11B, the light blocking material BAM may be patterned through a patterning process using a mask MASK. The patterning process may include a dry etching process and/or a wet etching process. Accordingly, an optical pattern layer CML may be formed to include the light blocking part BA, and the light transmitting part TA corresponding to the opening OPN of the optical pattern layer CML.

Figure 11C:
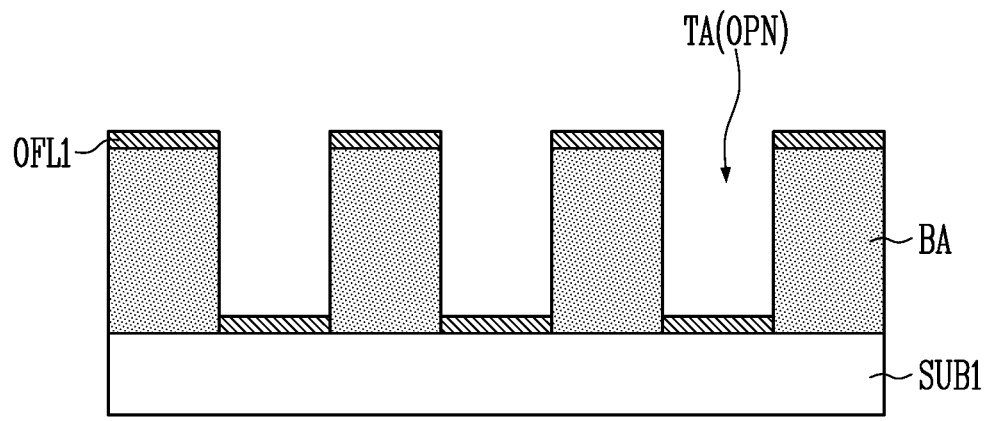

As shown in FIG. 11C, the first filter layer OFL1 having a first refractive index may be stacked on the light blocking part BA and the light transmitting part TA. In an embodiment, the first filter layer OFL1 may include an inorganic material, and may be formed through a deposition process. For example, the first filter layer OFL1 may be formed through at least one from among a chemical vapor deposition (CVD) process, a plasma enhanced chemical vapor deposition (PECVD), a high density plasma-chemical vapor deposition (HDP-CVD) process, a thermal deposition process, a vacuum deposition process, a spin coating process, a sputtering process, an atomic layer deposition (ALD) process, and a printing process. The first filter layer OFL1 may be formed to have a thickness less than 1 μm.

However, the present disclosure is not limited thereto, and the first filter layer OFL1 may be formed of an organic material, for example, such as PET. The first filter layer OFL1 including the organic material may be formed through various suitable printing processes and/or coating processes.

Figure 11D:
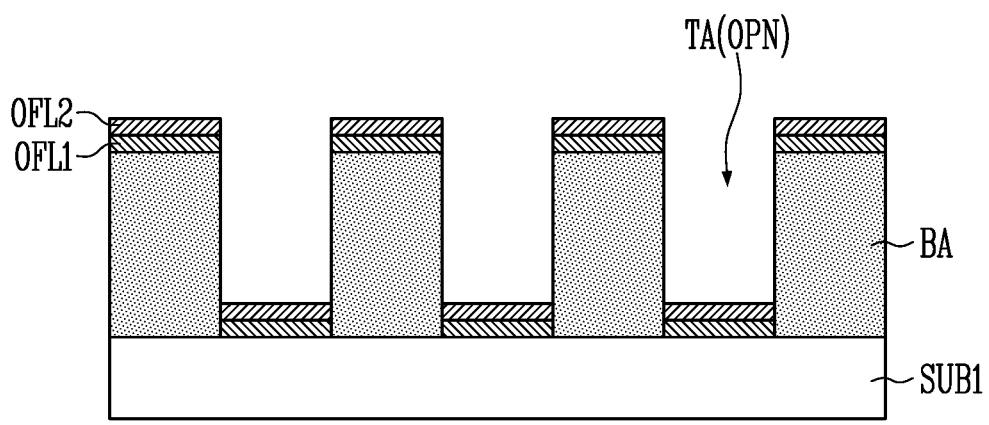

As shown in FIG. 11D, the second filter layer OFL2 having a second refractive index may be stacked on the first filter layer OFL1. The second refractive index may be different from the first refractive index, and the second filter layer OFL2 may include an inorganic material that is different from that of the first filter layer OFL1.

The second filter layer OFL2 may be formed through at least one from among a chemical vapor deposition (CVD) process, a plasma enhanced chemical vapor deposition (PECVD), a high density plasma-chemical vapor deposition (HDP-CVD) process, a thermal deposition process, a vacuum deposition process, a spin coating process, a sputtering process, an atomic layer deposition (ALD) process, and a printing process. The second filter layer OFL2 may be formed to have a thickness less than 1 μm.

However, the present disclosure is not limited thereto, and the second filter layer OFL2 may be formed of an organic material, for example, such as PET.

Figure 11E:
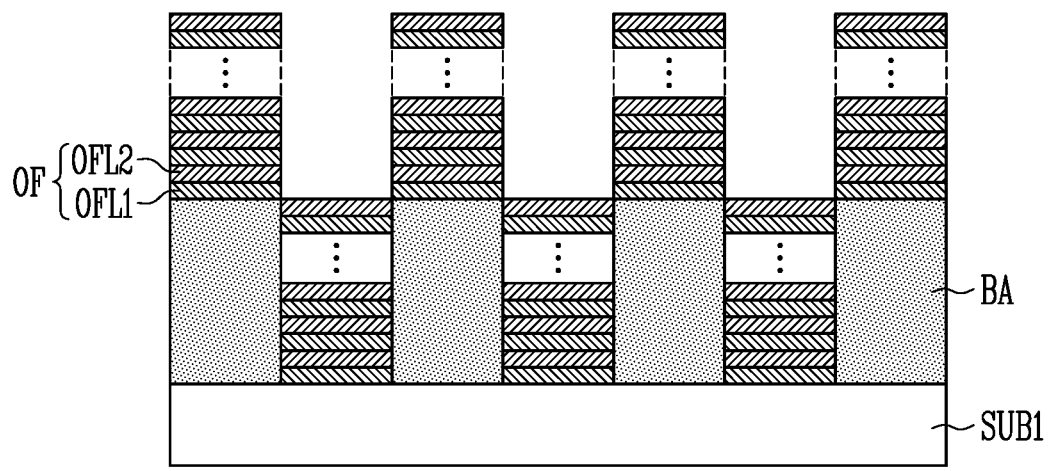

As shown in FIG. 11E, a process of alternately stacking the first filter layer OFL1 and the second filter layer OFL2 may be repeated. In an embodiment, when the first filter layer OFL1 and the second filter layer OFL2 include an inorganic material, each of the first and second filter layers OFL1 and OFL2 may be alternately stacked in eight layers or more. Accordingly, the optical filter OF may be formed by stacking the first and second filter layers OFL1 and OFL2 on one another.

In another embodiment, when both of the first filter layer OFL1 and the second filter layer OFL2 include (e.g., are formed of) organic materials having different refractive indices from each other, each of the first and second filter layers OFL1 and OFL2 may be alternately stacked in about 500 layers.

In still another embodiment, one of the first filter layer OFL1 and the second filter layer OFL2 may be an organic layer, and the other of the first filter layer OFL1 and the second filter layer OFL2 may be an inorganic layer.

Figure 11F:
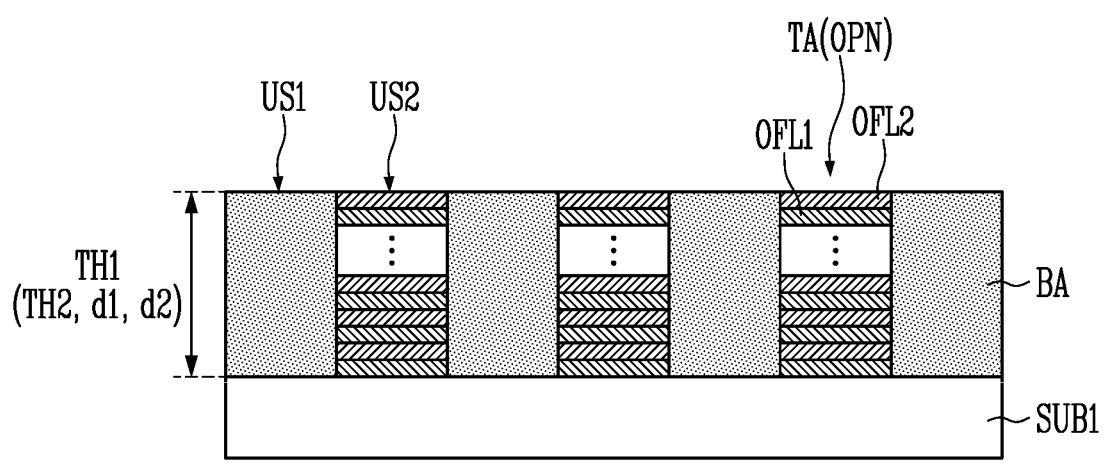

As shown in FIG. 11F, a top surface US2 of the optical filter OF may be polished. In an embodiment, a chemical mechanical polishing (CMP) process may be performed on the optical filter OF and the light blocking part BA, such that a top surface US1 of the light blocking part BA and the top surface US2 of the optical filter OF are planarized or substantially planarized.

Accordingly, a thickness TH2 of the optical filter OF may be formed to be less than or equal to (or substantially equal to) a thickness TH1 of the light blocking part BA. For example, the thickness TH2 of the optical filter OF and the thickness TH1 of the light blocking part BA may be the same or substantially the same as each other. In addition, a distance d2 between the top surface US2 of the optical filter OF and the first substrate SUB1 may be equal to or substantially equal to a distance d1 between the top surface US1 of the light blocking part BA and the first substrate SUB1.

Figure 11G:
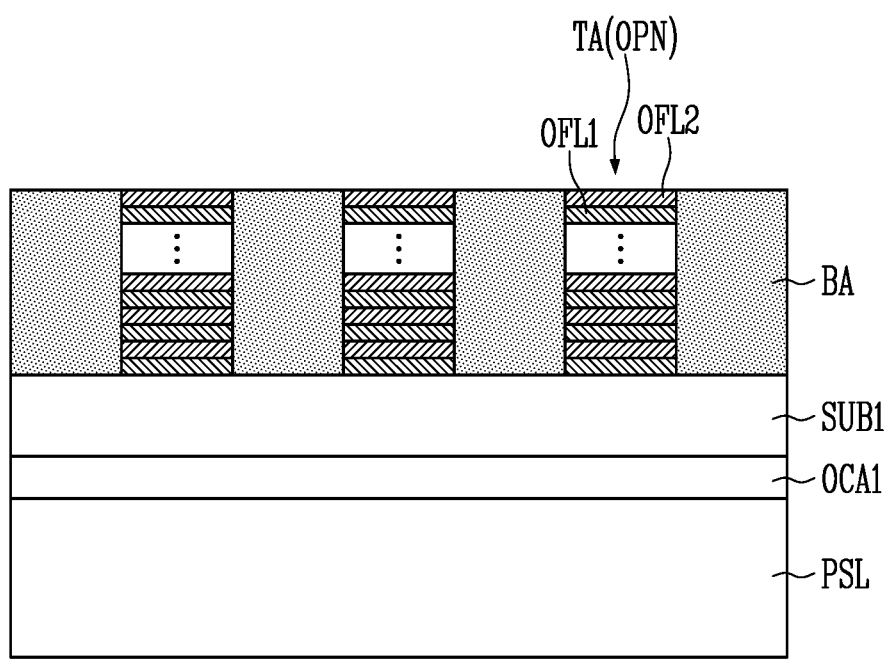

As shown in FIG. 11G, the first substrate SUB1, on which the optical pattern layer CML and the optical filter OF are formed, may be provided on the photo sensor layer PSL, which may receive light reflected from an external object. In an embodiment, a top surface of the photo sensor layer PSL may be attached to a bottom surface of the first substrate SUB1 by a first adhesive member OCA1. The first adhesive member OCA1 may be a transparent optically clear adhesive, but the present disclosure is not limited thereto.

Figure 11H:
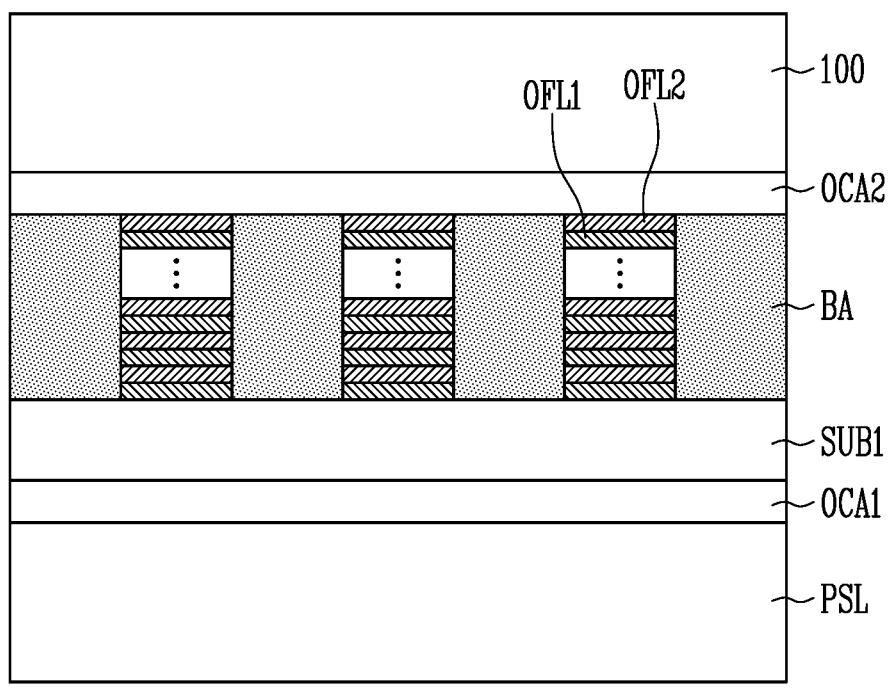

As shown in FIG. 11H, a display panel 100 may be provided on the light blocking part BA and the optical filter OF. In an embodiment, the top surfaces of the light blocking part BA and the optical filter OF may be attached to a bottom surface of the display panel 100 by a second adhesive member OCA2. The second adhesive member OCA2 may be a transparent optically clear adhesive, but the present disclosure is not limited thereto.

According to one or more example embodiments as described above, the optical filter OF, which blocks or substantially blocks transmission of light having a particular or a predetermined wavelength (e.g., about 580 nm or more), may be integrally formed with the optical pattern layer CML having the collimator array structure, for example, using the method described above. In other words, the optical filter OF, which may be a separate part or a separate film from the optical pattern layer CML in a comparative example, may be integrally formed with the optical pattern layer CML according to one or more example embodiments of the present disclosure, so that a space and/or a manufacturing process for an arrangement of the optical filter OF may be reduced. Accordingly, the thickness and/or manufacturing costs of the display device may be reduced.

Figure 12:
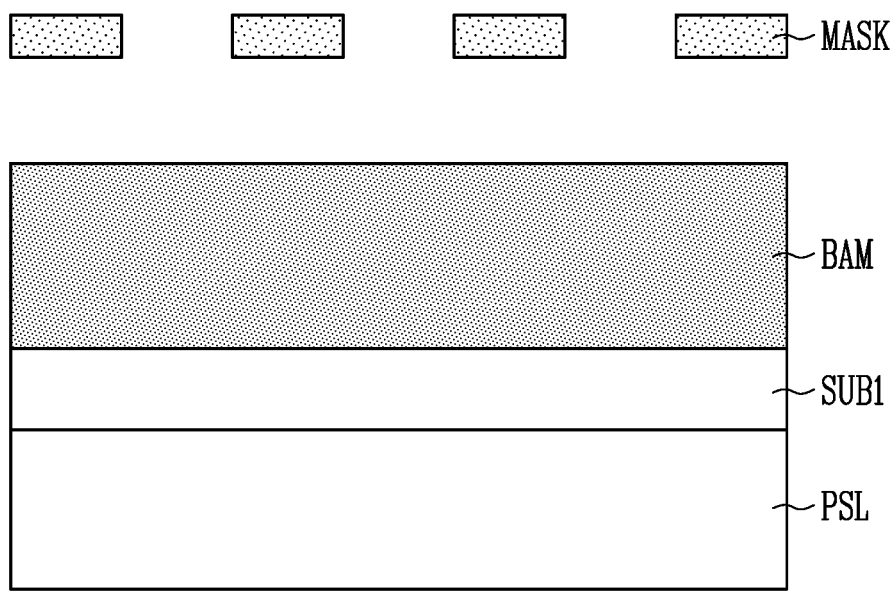
FIG. 12 is a sectional view illustrating an example of the method of manufacturing the display device in accordance with one or more example embodiments of the present disclosure.

FIG. 12 is a sectional view illustrating an example of the method of manufacturing the display device in accordance with one or more example embodiments of the present disclosure.

The method shown in FIG. 12 is the same or substantially the same as the processes of the method shown in FIGS. 11A to 11H, except a process of coating the light blocking material BAM on the first substrate SUB1 may be performed after the first substrate SUB1 is formed on the photo sensor layer PSL. Therefore, components in FIG. 12 that are the same or substantially the same as those described with reference to FIGS. 11A to 11H are designated by like reference symbols, and redundant description thereof may not be repeated.

Referring to FIG. 12, the first substrate SUB1 may be formed on the photo sensor layer PSL, and then the light blocking material BAM may be coated on the first substrate SUB1.

In other words, in some embodiments, the process of forming the optical pattern layer and the optical filter may be consecutively performed with the process of forming the photo sensor layer PSL. Accordingly, in this case, the adhesive member OCA (e.g. shown in FIG. 6) and the first substrate SUB1 may be omitted. For example, the first substrate SUB1 in FIG. 12 may be the same as the second encapsulation layer TFEL2 (e.g., shown in FIG. 6). Thus, the thickness of the display device may be further reduced.

Subsequently, the processes shown in FIGS. 11B to 11F may be performed on the resultant structure of FIG. 12.

Figure 13:
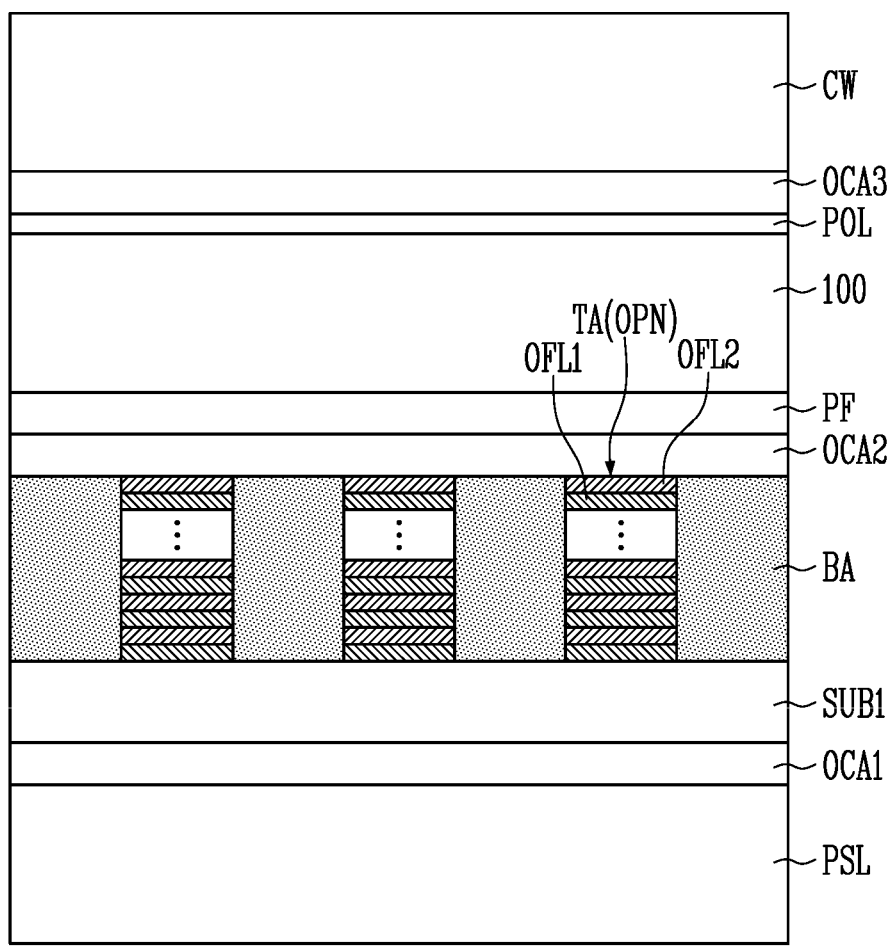
FIG. 13 is a sectional view schematically illustrating another example of the display device shown in FIG. 1.

FIG. 13 is a sectional view schematically illustrating another example of the display device shown in FIG. 1.

Referring to FIGS. 1, 3, 6, and 13, the display device 10 may include a first substrate SUB1, an optical pattern layer CML, an optical filter OF, a display panel 100, a cover window CW, and a photo sensor layer PSL.

In an embodiment, a protective film PF may be further disposed on a bottom (e.g., a bottom surface) of the display panel 100. The protective film PF may be disposed to block or substantially block introduction of a pollutant, may improve the durability of the display panel 100, and may enhance adhesion between an adhesive member OCA2 and the display panel 100.

A polarizing layer POL may be disposed on the display panel 100. The polarizing layer POL may increase the reliability of light provided to the photo sensor layer through the first and second filter layers OFL1 and OFL2. Also, the polarizing layer POL may improve the visibility of an image.

The polarizing layer POL and the cover window CW may be attached to each other by an adhesive member OCA3.

In the display device and the method of manufacturing the same in accordance with one or more example embodiments of the present disclosure, the optical filter OF, which may block or substantially block the transmission of light having a particular or predetermined wavelength (e.g., about 580 nm or more), may be integrally formed with the optical pattern layer CML having the collimator array structure. In other words, the optical filter OF, which may be a separate part or a separate film from the optical pattern layer CML in a comparative example, may be integrally formed with the optical pattern layer CML, so that a space and/or a manufacturing process of the display device used for an arrangement of the optical filter OF may be reduced. Accordingly, the thickness and/or manufacturing costs of the display device may be reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:
1. A display device comprising:
   a photo sensor layer configured to receive light reflected from an external object;
   a substrate on the photo sensor layer;
   an optical pattern layer on the substrate, the optical pattern layer comprising a light blocking portion, and a light transmitting portion corresponding to an opening penetrating the light blocking portion in one direction;
   an optical filter in the light transmitting portion of the optical pattern layer; and
   a light emitting device layer on the optical pattern layer.
2. The display device of claim 1, wherein the optical filter comprises at least two filter layers having different refractive indices from each other.
3. The display device of claim 2, wherein the optical filter comprises:
   a first filter layer having a first refractive index; and a second filter layer having a second refractive index different from the first refractive index,
wherein the first filter layer and the second filter layer are alternately stacked on one another.

4. The display device of claim 3, wherein each of the first filter layer and the second filter layer comprises eight stacked layers or more.

5. The display device of claim 3, wherein the first filter layer and the second filter layer comprise different inorganic materials from each other.

6. The display device of claim 3, wherein a difference between the first refractive index and the second refractive index is greater than 0.3.

7. The display device of claim 5, wherein the first filter layer comprises silicon oxide, and the second filter layer comprises titanium oxide.

8. The display device of claim 3, wherein a thickness of the optical filter is less than or equal to a thickness of the light blocking portion.

9. The display device of claim 8, further comprising:
a transparent layer at at least one of an upper portion and a lower portion of the optical filter,
wherein the transparent layer is filled in the light transmitting portion.

10. The display device of claim 3, wherein a distance between a top surface of the optical filter and the substrate is less than or equal to a distance between a top surface of the light blocking portion and the substrate.

11. The display device of claim 3, wherein the optical filter is configured to block light having a wavelength greater than or equal to 580 nm from being transmitted through to the photo sensor layer.

12. The display device of claim 3, wherein a side surface of the first filter layer and a side surface of the second filter layer are in direct contact with a side surface of the light blocking portion.

13. The display device of claim 2, wherein the optical pattern layer includes an optical collimator array, and is configured to transfer the reflected light to the photo sensor layer.

14. The display device of claim 2, wherein the optical pattern layer comprises at least one from among an organic light blocking material and a metal light blocking material.

15. A method of manufacturing a display device, the method comprising:
coating a light blocking material on a substrate;
forming an optical pattern layer by patterning the light blocking material, the optical pattern layer comprising a light blocking portion, and a light transmitting portion corresponding to an opening penetrating the light blocking portion in one direction;
alternately stacking a first filter layer having a first refractive index and a second filter layer having a second refractive index on the light blocking portion and the light transmitting portion;
forming an optical filter by repeating the stacking of the first filter layer and the second filter layer;
polishing a top surface of the optical filter; and
providing a display panel including a light emitting device layer on the substrate on which the optical pattern layer and the optical filter are formed.

16. The method of claim 15, wherein the optical filter is formed in the light transmitting portion of the optical pattern layer.

17. The method of claim 16, wherein a distance between the polished top surface of the optical filter and the substrate is less than or equal to a distance between a top surface of the light blocking portion and the substrate.

18. The method of claim 15, further comprising:
providing the substrate on which the optical pattern layer and the optical filter are formed on a photo sensor layer configured to receive light reflected from an external object.

19. The method of claim 18, wherein the optical filter is configured to block light having a wavelength greater than or equal to 580 nm from being transmitted through to the photo sensor layer.

20. The method of claim 15, wherein the first filter layer and the second filter layer comprise different inorganic materials from each other, and
wherein a difference between the first refractive index and the second refractive index is greater than 0.3.

* * * * *